United States Patent [19]
Higashikawa

[11] Patent Number: 5,981,934
[45] Date of Patent: Nov. 9, 1999

[54] PHOTOVOLTAIC ELEMENT HAVING A TRANSPARENT CONDUCTIVE LAYER WITH SPECIFIED FRACTAL DIMENSION AND FRACTAL PROPERTY

[75] Inventor: Makoto Higashikawa, Kyotanabe, Japan

[73] Assignee: Canon Kabushiki Kaisha, Tokyo, Japan

[21] Appl. No.: 08/925,751

[22] Filed: Sep. 9, 1997

[30] Foreign Application Priority Data

Sep. 12, 1996 [JP] Japan ................................. 8-241934

[51] Int. Cl.$^6$ ..................................... H01J 40/14
[52] U.S. Cl. ................... 250/214 R; 250/214.1; 257/638
[58] Field of Search .............. 250/214 R, 214.1; 257/629, 631, 634, 635, 633, 638

[56] References Cited

U.S. PATENT DOCUMENTS 4,532,372  7/1985  Nath ........................................ 136/256
5,557,141  9/1996  Harada et al. .......................... 257/631

FOREIGN PATENT DOCUMENTS 59-43101  10/1984  Japan .
60-84888   5/1985   Japan .
60-41878   9/1985   Japan .

OTHER PUBLICATIONS

T. Tiedje et al., "Enhanced Optical Absorption Produced by Light Trapping in Amorphous Silicon Films", Proc. 16th IEEE Photovoltaic Specialist Conf. (1982), pp. 1423–1424, Jan. 1982.

H. Deckman et al., "Optical Enhancement of a–SiHx Solar Cells", Proc. 16th IEEE Photovoltaic Specialist Conf. (1982), pp. 1425–1426, Jan. 1982.

Y. Hamakawa et al., "New types of high efficiency solar cells based on a–Si", Appl. Phys. Lett., vol. 43, No. 7, Oct. 1, 1983, pp. 644–646.

*Primary Examiner*—Que T. Le
*Attorney, Agent, or Firm*—Fitzpatrick, Cella, Harper & Scinto

[57] ABSTRACT

This invention is to provide a photovoltaic element capable of improving the production yield in the manufacturing process and the reliability such as the weather resistance and the durability, while also improving the photoelectric conversion efficiency by the light enclosing effect. For attaining such object, the photovoltaic element is featured by a fact that the transparent conductive layer, positioned between the substrate and the semiconductor layers, is provided, at a face in contact with the semiconductor layers, with a fractal structure of a fractal dimension D within a range of $1.01 \leq D \leq 1.20$ at least within a dimensional range from 40 to 400 nm.

12 Claims, 11 Drawing Sheets

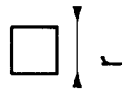
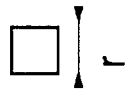
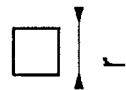
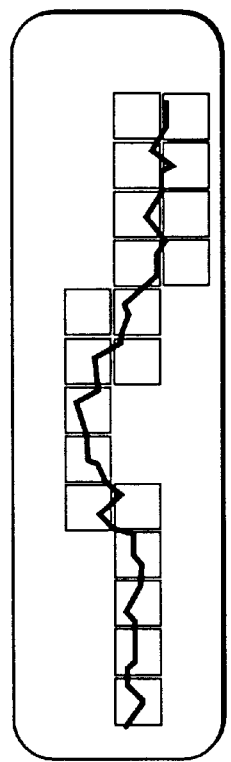
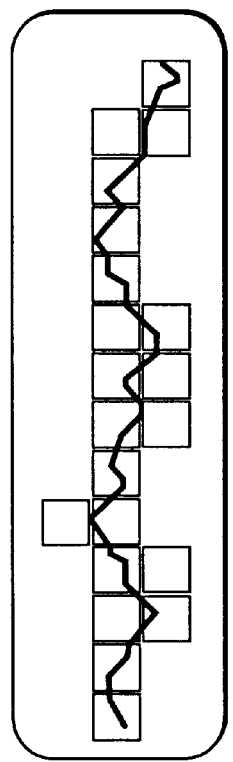
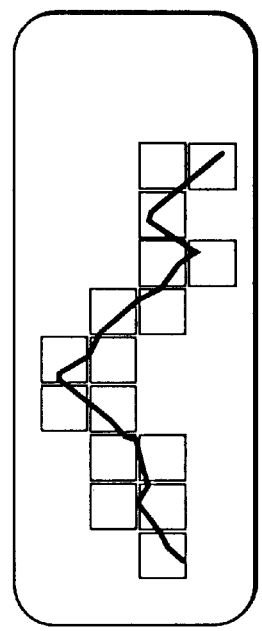
FIG. 4A

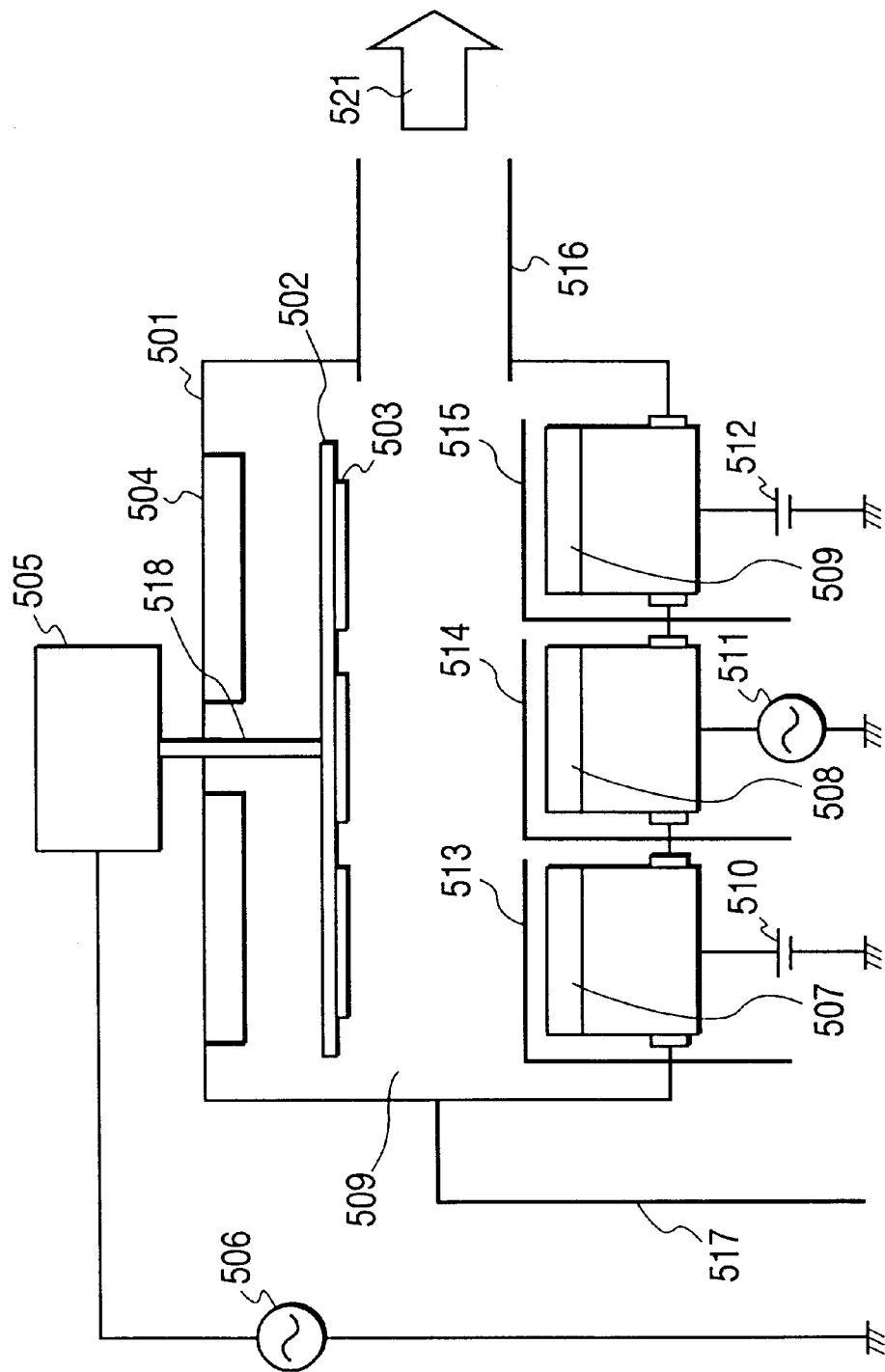

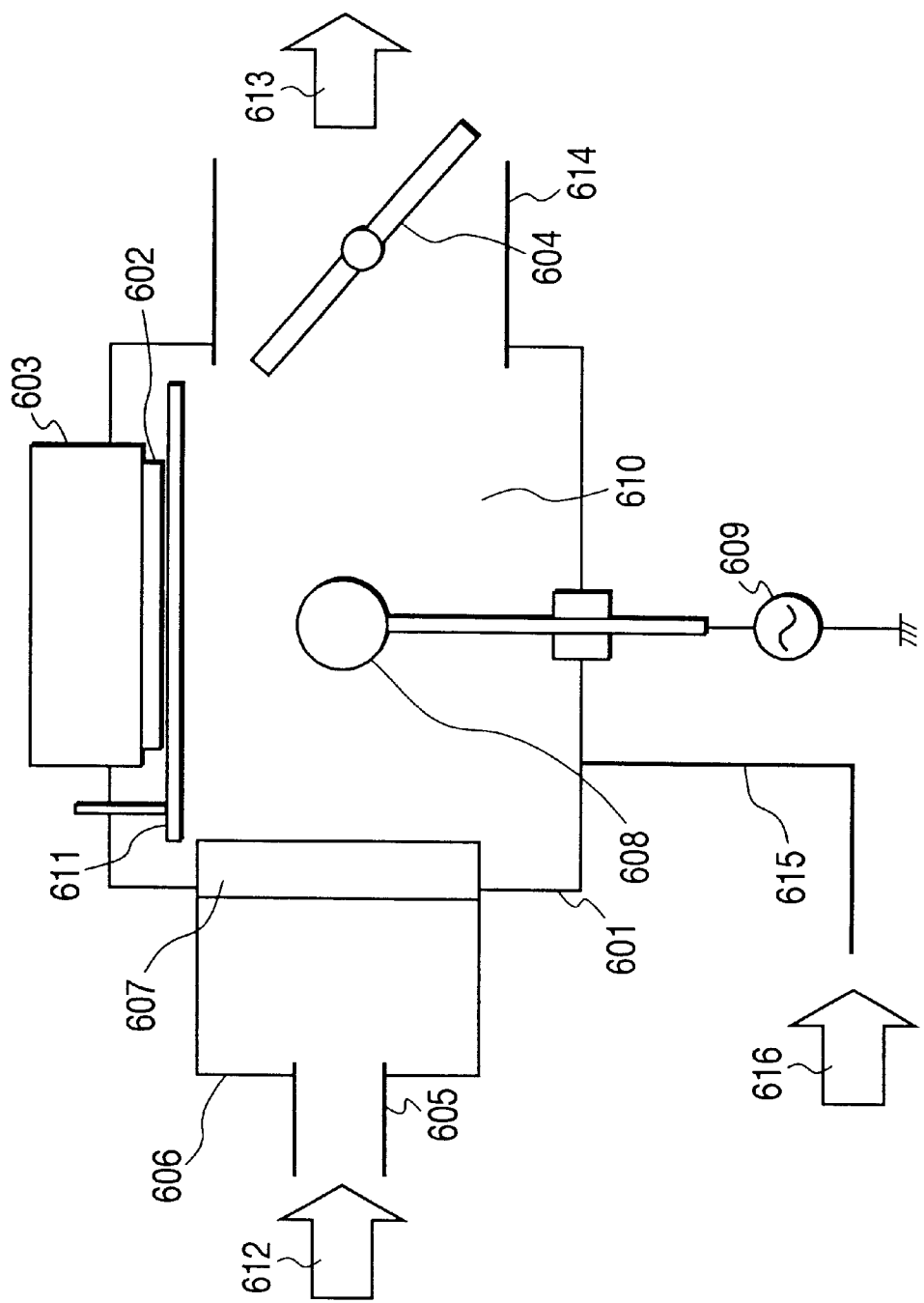

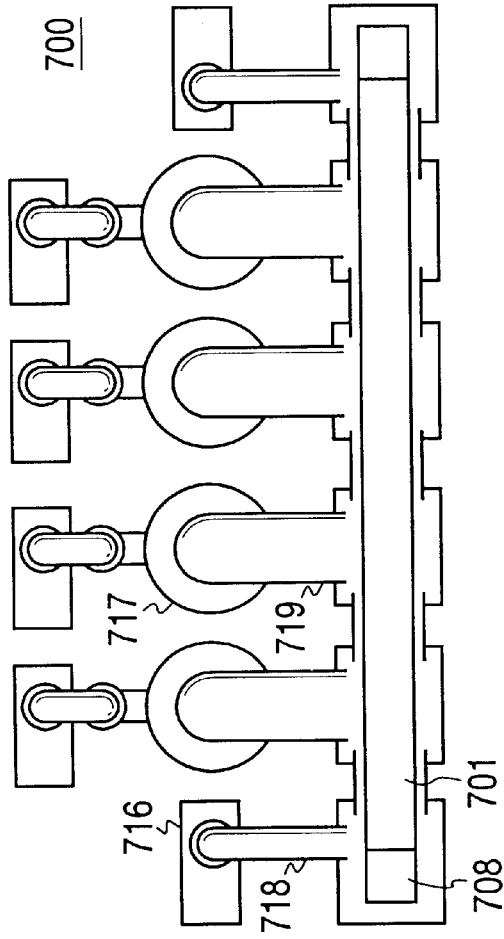
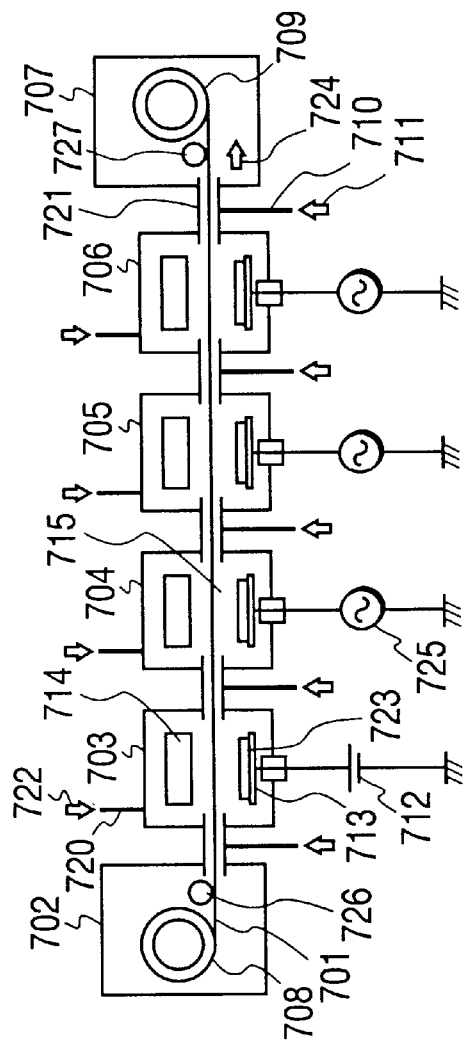
FIG. 7A
FIG. 7B

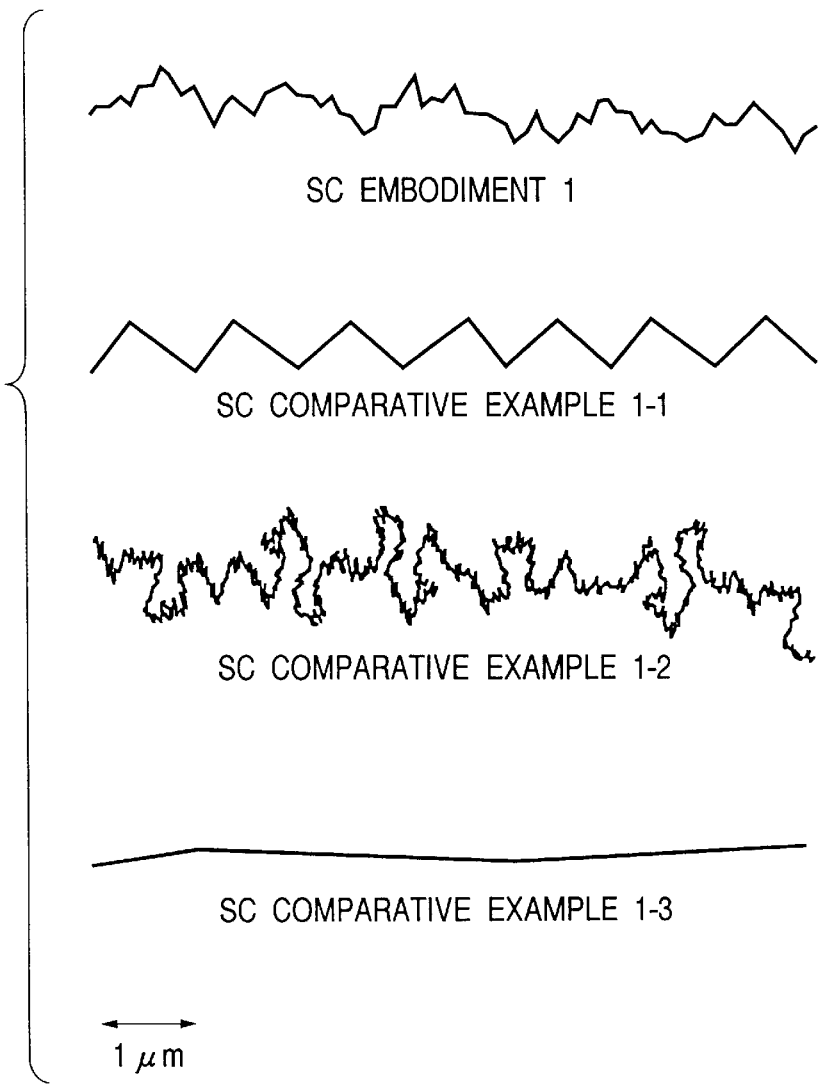

PHOTOVOLTAIC ELEMENT HAVING A TRANSPARENT CONDUCTIVE LAYER WITH SPECIFIED FRACTAL DIMENSION AND FRACTAL PROPERTY

BACKGROUND OF THE INVENTION

1. Field of the Invention

The present invention relates to a photovoltaic element capable of improving the photoelectric converting efficiency by a light enclosing effect, while improving also the yield in the manufacture, the weather resistance and the durability.

2. Related Background Art

There is already known a technology of forming, on a side of the photovoltaic element opposite to the light entrance side, a reflective layer composed of a metal film of high reflectance such as Ag, Al, Cu or Au. This technology serves to reflect the light, transmitted by the carrier-generating semiconductor layer, to stimulate the absorption again in the semiconductor layer, thereby increasing the light absorption in the thin semiconductor layer, thus increasing the output current and improving the photoelectric converting efficiency.

Also a transparent conductive layer may be provided between the rear electrode and the semiconductor layer to provide the following effects:

(1) improving flatness of the rear electrode, improving adhesion of the semiconductor layer and/or preventing alloy formation between the metal of the rear electrode and that of the semiconductor layer (cf. Japanese Patent Publication Nos. 59-43101, (Fuji Electric Mfg. Co. and 60-41878 Sharp Corp.);

(2) decreasing the current in the defect area of the semiconductor layer (Japanese Patent Application Laid-open No. 60-84888, Energy Conversion Devices, Inc.); and (3) increasing the sensitivity in the long-wavelength region within the spectral sensitivity range of the solar cell (Y. Hamanaka et al., Appl. Phys. Lett., 43(1983) p. 644).

It is also known to form, on the rear electrode, a light-scattering texture in the order of wavelength of the scattered light, thereby scattering the long-wavelength light that cannot be absorbed in the semiconductor layer and extending the optical path length in the semiconductor layer, thereby improving the long-wavelength sensitivity of the photovoltaic element, increasing the short-circuit current and improving the photoelectric converting efficiency (T. Tiedje et al., Proc. 16th IEEE Photovoltaic Specialist Conf. (1982) p. 1423, H. Deckman et al., Proc. 16th IEEE Photovoltaic Specialist Conf. (1982) p. 1425).

By combining these technologies, an optimum configuration is considered to be provided with a metal film, serving as the rear reflective layer and also as the rear electrode, having a light-scattering surface texture in the order of the wavelength of the light and also having a high reflectivity, and also with a transparent conductive layer positioned between the rear reflective layer and the semiconductor layer.

FIG. 2A is a cross-sectional view of a conventional photovoltaic element, wherein provided in succession, on a substrate 201, are a transparent conductive layer 202, a semiconductor pin junction 203–205, a transparent electrode 206 and a current-collecting electrode 207. In another configuration shown in FIG. 2B, a metal layer 208 is provided between the substrate 201 and the transparent conductive layer 202.

However the manufacture of the photovoltaic element with the transparent conductive layer and the metal layer of the prior art has resulted in certain drawbacks in terms of process efficiency and durability.

In case of forming the semiconductor layer on a surface having pyramidal texture (cf. Tiedje et al., Proc. 16th IEEE Photovoltaic Specialist Conf. (1982) p. 423), a stress is generated at the pyramidal vertexes, inducing the formation of a defect in the semiconductor layer. Also upon voltage generation, the electric field is concentrated at the pyramidal vertexes to increase the leak current of the photovoltaic element through the defect or the like of the semiconductor layer, whereby the production yield of the photovoltaic element is deteriorated.

Also the semiconductor layer formed on the surface having pyramidal texture shows a stronger electric field at the pyramidal vertexes in comparison with the semiconductor layer formed on a flat surface, and the resulting uneven electric field tends to deteriorate the open-circuit voltage (Voc) and the fill factor (FF) of the photovoltaic element, in comparison with that formed on the surface of a flat substrate.

Also the photovoltaic element may show increases in the photodeterioration (deterioration of the element characteristics by prolonged light irradiation) and deterioration by vibration (deterioration of the element characteristics by prolonged vibration). The photodeterioration of the photovoltaic element is assumed to result from cleavage of weak bonds by the light energy, constituting recombination centers for the photoinduced carries and thus deteriorating the characteristics of the element. Also the deterioration of the photovoltaic element by vibration is assumed to result from cleavage of weak bonds by the vibrational energy, constituting recombination centers for the photoinduced carries and thus deteriorating the characteristics of the element. Such weak bonds are considered to be localized in the area where a stress is generated.

Also when Ag or Cu is employed in the rear reflective metal layer, it has been found, if the humidity is high and a positive bias voltage is applied to the rear reflective metal layer, that Ag or Cu migrates to form conductive tracts to the electrode at the light entrance side, inducing shunt or short-circuiting of the photovoltaic element. Such a phenomenon is particularly conspicuous in case the rear reflective metal layer has a surface texture in the order of the wavelength of the light.

On the other hand, the rear electrode formed flat is associated with drawbacks of insufficient light absorption in the semiconductor layer because of the limited light scattering at the rear side and of insufficient adhesion between the substrate and the rear reflective layer, depending on the combination of the materials constituting the substrate and the rear electrode, eventually leading to the peeling of the rear reflective layer from the substrate in the post-working steps of the photovoltaic element.

Furthermore, in a post-working step for eliminating the electrical shunt in the defect area, in case of a surface with pyramidal vertexes, the reaction may proceed excessively at the vertex of the isolated steep pyramid, thus causing damage to the defect-free area. In such substrate, this fact limits the range of condition setting in the above-mentioned step of eliminating the electrical shunt in the defect area. Consequently this fact necessitates stricter control of the production process, thus deteriorating the productivity.

The above-mentioned drawbacks become particularly conspicuous when the production process is designed for lost cost for realizing practical use of the photovoltaic elements, such as the use of an inexpensive substrate such as a resinous film or a stainless steel plate, or of a higher formation speed of the semiconductor layer, and are factors deteriorating the production yield of the photovoltaic elements.

SUMMARY OF THE INVENTION

An object of the present invention is to provide a photovoltaic element characterized by a transparent conductive layer, positioned between the substrate and the semiconductor layer, provided at the interface with the semiconductor layer, with a fractal cross-sectional structure with a fractal dimension D within a range of $1.01 \leq D \leq 1.20$ at least within a range from 40 to 400 nm.

Another object of the present invention is to provide such photovoltaic element having a metal layer between the transparent conductive layer and the substrate.

Such configuration allows improvement of the open-circuit voltage and the short-circuiting current of the photovoltaic element, thereby improving the photoelectric converting efficiency, and suppression of the deterioration of the photovoltaic element resulting from light irradiation or vibration, and improvement of the durability in the high-temperature high-humidity inverse bias test. Also such configuration avoids peeling of the layers even in a state where the photovoltaic element is rolled and is under a mechanical stress.

BRIEF DESCRIPTION OF THE DRAWINGS

FIGS. 4A and 4B are views showing the concept of box counting method;

FIG. 5 is a schematic view showing an apparatus for forming the transparent conductive layer of the photovoltaic element of the present invention;

FIG. 6 is a schematic view showing an apparatus for forming the semiconductor layer of the photovoltaic element of the present invention;

FIGS. 7A and 7B are respectively a plan view and an elevation view, showing an apparatus for forming the rear reflective layer and the transparent conductive layer of the photovoltaic element of the present invention;

FIG. 10 is a chart showing the surface shape of the thin conductive layer in the embodiment 1 and the comparative example 1.

DESCRIPTION OF THE PREFERRED EMBODIMENTS

Figure 1A:
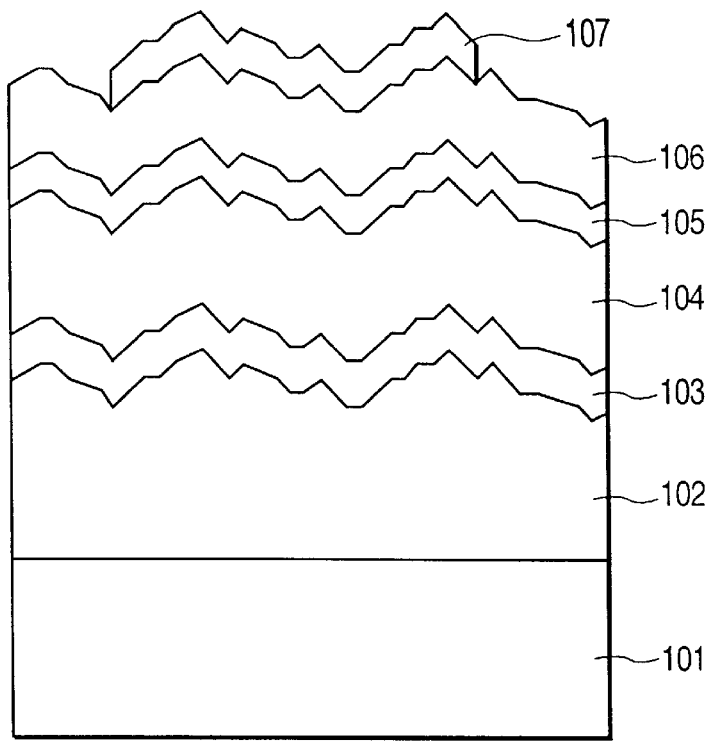
FIGS. 1A and 1B are cross-sectional views of photovoltaic elements of the present invention.

In the following the present invention will be explained with reference to FIG. 1A. On a substrate 101, there are laminated in succession, a transparent conductive layer 102 of the present invention, a pin junction 103–105, a transparent electrode 106, and a current-collecting electrode 107. As shown in FIG. 1B, a metal layer 108 may be provided between the substrate 101 and the transparent conductive layer 102.

[Transparent conductive layer]

The transparent conductive layer 102 features the present invention, particularly in the surface structure thereof. The present inventors have found that the short-circuiting current of the photovoltaic element can be increased if the cross-sectional structure of the transparent conductive layer has a fractal property, in particular a specified fractal dimension. The fractal property means a structure in which the structural shape of a pattern contains a self-similar shape therein. The fractal dimension means a parameter indicating the complexity of the shape of the pattern. As an example, a two-dimensionally drawn line segment is, in the most simple form, a straight line, which has the fractal dimension of 1. As the line segment becomes folded in a complex manner to fill the two-dimensional plane, the fractal dimension thereof approaches 2. Thus the fractal dimension D of a line segment is within a range $1 \leq D \leq 2$. In the following there will be explained, with reference to FIGS. 4A and 4B, the method of calculating the fractal dimension of the cross-sectional structure of the transparent conductive layer by a box counting method.

Figure 4B:
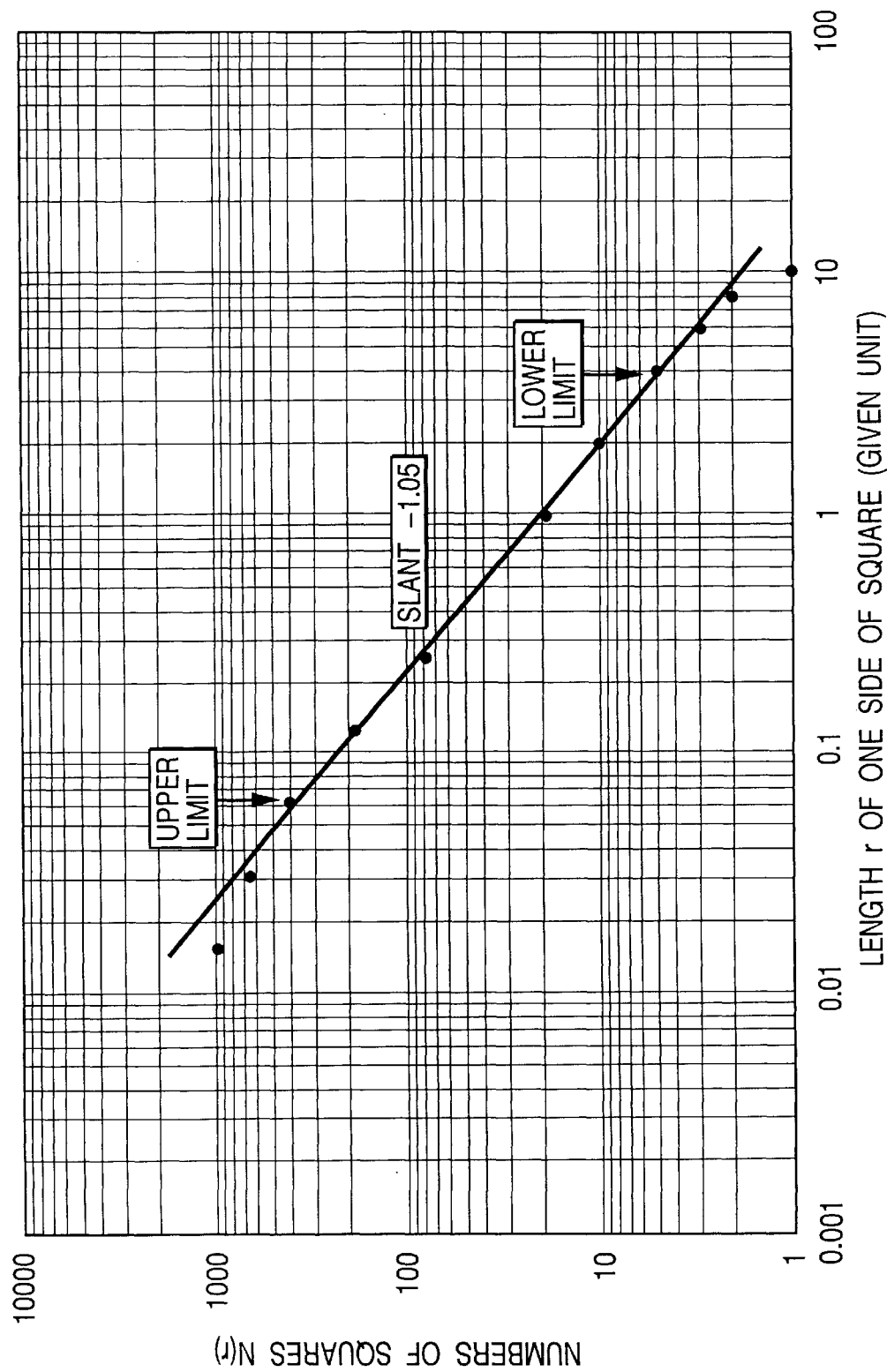

At first the photovoltaic element is cut in an arbitrary position, and the cross section of the transparent conductive layer is photographed with an SEM, in different scales. In FIG. 4A, (a), (b) and (c) are respectively a photograph of a certain area, and partial photographs of the same area in 4× and 8× magnifications. Then the plane of each photograph is divided into squares of a side r, and there is counted the number N(r) of the squares containing the line segment. In (a) of FIG. 4A, 19 squares contain the line segment. (b) of FIG. 4A shows only a part of the same area as in (a) of FIG. 4A magnified in a 4× magnification, and the line segment is contained in fact in 78 squares. (c) of FIG. 4A similarly shows a part of the same area magnified in an 8× magnification, and the line segment is contained in fact in 185 squares. In these drawings, the plane is divided into squares of a same size, with a side of r, but the actual length is represented, in (a) of FIG. 4A, by r=R, in (b) of FIG. 4A, by r=R/4 and in (c) of FIG. 4A, by r=R/8. Such box counting is conducted on a same area with different scales, such as 20 times, 100 times, 1/10 times 1/100 times etc. Then log N(r) is plotted as a function of log r on a log-log chart to obtain a chart as shown in FIG. 4B. The chart indicates that a relation $N(r) \, r^{-D}$ stands within a certain range of r. Stated differently, the slope is constant within a certain range. Within this range, the pattern is called to have the fractal property, and the above-mentioned D, called fractal dimension, is given by definition from the inclination of the graph. In the illustrated example, the fractal dimension D is 1.05.

Based on the investigation of the relationship between the shape and the characteristics of the photovoltaic element from various standpoints, it is found preferable that the cross-sectional structure along an arbitrary cross section has the fractal property at least within a range from r=40 to 400 nm.

If the upper limit of the range of the fractal property is smaller than 40 nm, the effect of increasing the random reflection at the rear side of the photoelectric element is decreased. On the other hand, if the lower limit of the range of the fractal property is larger than 400 nm, the adhesion tends to become weaker, whereby peeling may result between the transparent conductive layer and the thin film laminated thereon or the defects may be formed to cause electric short-circuiting in the photoelectric converting layer.

Consequently the fractal property preferably stands at least in a range from 40 to 400 nm, more preferably at least from 20 to 500 nm, and most preferably from 20 to 700 nm.

It is also found that an excessively smaller fractal dimension D provides a flatter surface, decreasing the light scattering and the short-circuiting current (Jsc) of the photovoltaic element, while an excessively large fractal dimension provides an excessively complex shape, thus increasing the light absorption in the transparent conductive layer and decreasing the short-circuiting current Jsc of the photovoltaic element.

Also the results of the deterioration tests by light irradiation and vibration and of the high-temperature high-humidity inverse bias test, conducted as will be explained in the following examples, are summarized in Table 1. Based on these results, the fractal dimension D is preferably within a range of $1.01 \leq D \leq 1.20$, more preferably $1.03 \leq D \leq 1.18$ and most preferably $1.05 \leq D \leq 1.16$.

(3) The random reflection at the rear side of the photovoltaic element is increased to cause scattering of the long-wavelength light that cannot be fully absorbed in the semiconductor layer to extend the optical path length therein, thereby increasing the short-circuiting current Jsc of the photovoltaic element and improving the photoelectric converting efficiency.

(4) There is already achieved a reduction in the serial resistance of the photovoltaic element, leading to an improvement in the fill factor (FF) and in the photoelectric converting efficiency. The principle of reduction in the serial resistance is not yet clarified, but is presumed to be based on the improved adhesion between the thin film laminated on the transparent conductive layer and the conductive film.

(5) In comparison with the case of the conventional transparent conductive layer having uniform irregularities on the surface, the configuration of the present invention reduces the leak current of the photovoltaic element and improves the production yield thereof. Also there is achieved an improvement in the photoelectric conversion efficiency by the improvements in the open-circuit voltage Voc and the fill factor FF, while the short-circuiting current Jsc of the photovoltaic element is maintained at a high value. This effect is considered in the following manner.

TABLE 1

| Fractal dimension D | Initial conversion efficiency | Photodeterioration | Vibrational deterioration | High-temperature high-humidity inverse bias | Overall evaluation |
| --- | --- | --- | --- | --- | --- |
| 1.00 | | | | | |
| 1.01 | ± | + | ± | + | ± |
| 1.03 | + | + | ± | + | + |
| 1.05 | ++ | ++ | ++ | ++ | ++ |
| 1.09 | ++ | ++ | ++ | ++ | ++ |
| 1.15 | + | ++ | ++ | ++ | ++ |
| 1.18 | ± | + | ++ | ++ | + |
| 1.20 | ± | ± | ++ | + | ± |
| 1.25 | + | ± | + | − | − |

(++) 20% superior, (+) 10% superior, (±) comparable, and (−) inferior to the conventional fractal dimension D = 1.00

The above-explained fractal structure provides the following advantages:

(1) It improves the adhesion between the transparent conductive layer and the thin film laminated thereon, thereby eliminating the peeling between the transparent conductive layer and the overlying thin film in the production process of the photovoltaic element, thereby increasing the controllability and the freedom of the production process and improving the production yield of the photovoltaic element. Also it improves the weather resistance as revealed in the accelerated weather resistance tests such as the high-temperature high-humidity test and the salt water test.

(2) In the conventional flat substrate, the stress in the films laminated thereon cannot escape and the mechanical stress applied to a weak portion increases as the sum of the stress in the planar direction. A similar situation arises for the stress resulting from the difference in the thermal expansion coefficients. These stresses lead to peeling between the transparent conductive layer and the overlying thin film and formation of defects, inducing electrical short-circuiting in the photoelectric converting layer. On the other hand, according to the present invention, the fine surfacial structure relaxes the mechanical stress and the stress resulting from the difference in the thermal expansion coefficients, without stress accumulation in the planar direction, thereby reducing the peeling of the transparent conductive layer from the overlying thin film and the electrical short-circuiting in the photoelectric converting layer.

In the conventional texture having pyramidal irregularities as mentioned before or similar structures thereto, an enlargement of the irregularities, for increasing the light scattering effect, results in generation of a stress at the pyramidal vertexes, thus facilitating the formation of defects in the semiconductor layer or resulting in concentration of the electric field at the pyramidal vertexes upon voltage generation, thus inducing an increased leak current in the photovoltaic element through the defects in the semiconductor layer.

On the other hand, in the photovoltaic element of the present invention, the surfacial irregularities having a fractal structure involving self-similar structures therein and lacking isolated steep pyramidal vertexes reduces the formation of defects in the semiconductor layer, and also avoids the increase of the leak current of the photovoltaic element through the defects in the semiconductor layer, induced by the concentration of the electric field at the pyramidal vertexes. Also in comparison with the semiconductor layer formed on a flat surface, the semiconductor layer formed on a surface with pyramidal irregularities shows the concentration of the electric field at the pyramidal vertexes, leading to the formation of an uneven electric field, so that the open-circuit voltage Voc and the fill factor FF may become inferior in comparison with those in the photovoltaic element formed on the flat substrate. On the other hand, in the photovoltaic element of the present invention, the improved light scattering is presumed to achieve improvements in the open-circuit voltage Voc and in the fill factor FF while maintaining the high short-circuiting current Jsc, because the surfacial irregularities have a fractal structure involving self-similar structures therein and lack isolated steep pyramidal vertexes.

(6) Also the reduced internal stress at the interface between the transparent conductive layer and the photoelectric conversion layer suppresses the photodeterioration (deterioration of the characteristics of the element under prolonged light irradiation) and the vibrational deterioration (deterioration of the characteristics of the element under prolonged vibration). The photodeterioration of the photovoltaic element is assumed to be induced by the cleavage of the weak bonds by the energy of the light, thus creating the recombination centers for the photo-induced carries and deteriorating the characteristics of the element. Also the vibrational deterioration of the photovoltaic element is assumed to be induced by the cleavage of the weak bonds by the energy of the vibration, thus creating the recombination centers for the photo-induced carries and deteriorating the characteristics of the element. Such weak bonds are considered to be localized in the area involving stress.

(7) In the post-step for eliminating the electrical short-circuiting in the defect area, the configuration of the photovoltaic element of the present invention allows for widening the freedom of condition setting and obtaining a satisfactory level of recovery. This aspect facilitates the management of the production process and improves the productivity. This effect is based on the fact that the reaction does not proceed locally and does not cause local damages because of the absence of isolated steep pyramidal vertexes so that the defects are not generated.

Such surface as mentioned in the foregoing is composed of surfacial irregularities of a polycrystalline substance with certain particle sizes, a mixture of such substance with an amorphous substance, or a polycrystalline substance and an amorphous substance, and of surfacial irregularities of the substrate and/or the metal layer.

In case of a photovoltaic element in which the light is introduced to the semiconductor layer from the side of the substrate, the transparent conductive layer 102 or 302 is provided at the light-introducing surface of the semiconductor layer, serves to transmit the incident light and introduce the incident light into the photoelectric conversion layer after scattering at the interface, and also serves as the surface electrode of the photovoltaic element.

In such configuration, there is preferred, among the aforementioned materials, a material with a high optical transmittance and a high electrical conductivity. Particularly preferably the essential material is composed of an oxide or a nitride of aluminum, zinc, tin, indium, titanium or tantalum, or a complex compound thereof.

Also the thickness of the transparent conductive layer is preferably at least equal to 100 Å and not exceeding 10 μm, because a smaller thickness reduces the conductivity while a larger thickness increases the light absorption. Particularly preferred is the thickness at least equal to 300 Å and not exceeding 5 μm.

Figure 9:
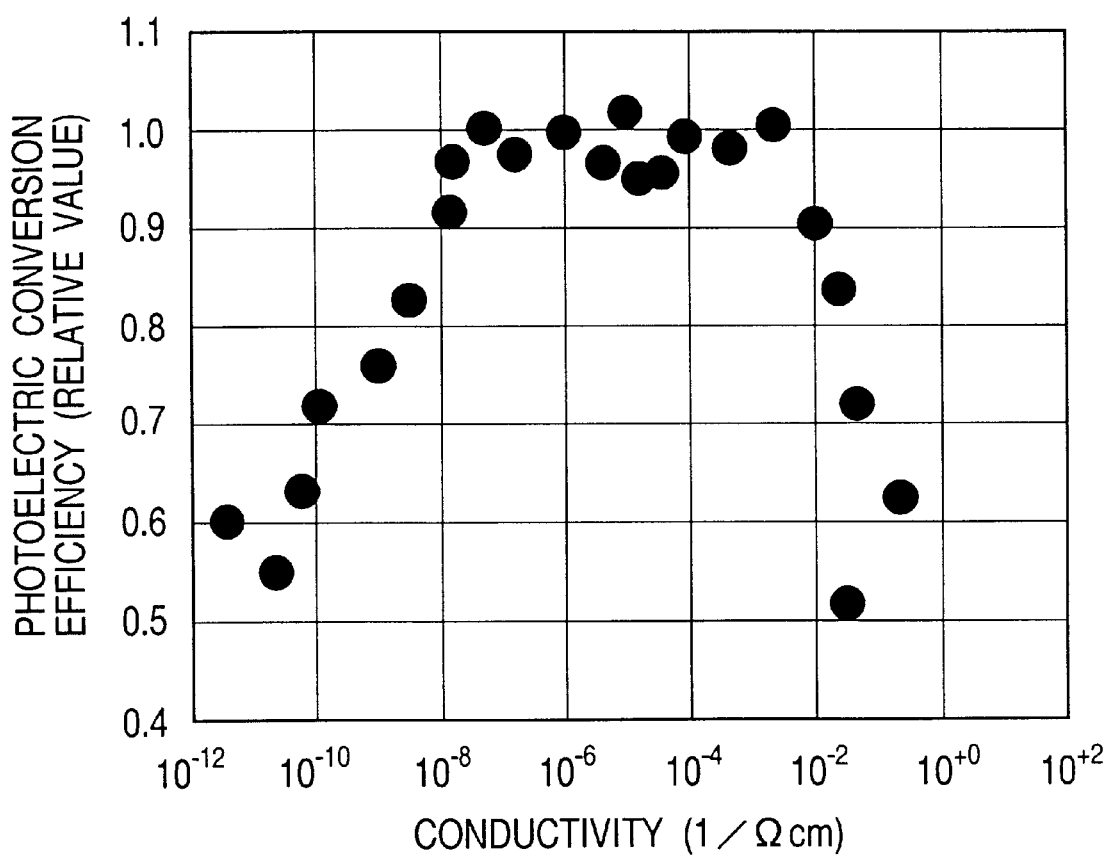
FIG. 9 is a chart showing the relationship between the electrical conductivity of the transparent conductive layer and the photoelectric conversion efficiency.

Also the photovoltaic element was prepared in the same method as in the ensuing embodiment 1, and there was investigated the relationship between the electric conductivity and the photoelectric conversion efficiency. In forming the transparent conductive layer by sputtering, aluminum oxide was simultaneously sputtered by embedding in the target of zinc oxide, whereby aluminum oxide was added to the transparent conductive layer composed of zinc oxide. The electrical conductivity increased with the increase in the amount of addition. As a result, as shown in FIG. 9, the photoelectric conversion efficiency of the photovoltaic element was lowered because of an excessively large shunt resistance when the conductivity was equal to or lower than 10E−8 (1/Ω cm), and the photoelectric conversion efficiency was lowered also because of an excessively small shunt resistance when the conductivity was equal to or higher than 10E−2 (1/Ω cm).

[Formation of transparent conductive layer]

The above-explained transparent conductive layer featuring the present invention can be formed by various CVD methods such as microwave plasma CVD, RF plasma CVD, light irradiation CVD, thermal CVD or MOCVD; various evaporation methods such as EB evaporation, sputtered evaporation, MBE, ion plating or ion beam evaporation; plating; or printing.

In the following there will be explained, as an example, the formation of a transparent conductive layer consisting of a metal layer and a transparent conductive layer by sputtering, but it is to be understood that the present invention is by no means limited by such example.

As an example there will be explained a case of employing Al for the metal layer and ZnO for the transparent conductive film. In this example, in order to obtain the surface featuring the present invention, the employed gas consists of Ar, $O_2$ and HF. Also important are the control of the deposition rate and the film forming temperature, the pressure in the deposition chamber and the ratio of Ar gas, $O_2$ and HF gas. A relatively high deposition rate is preferred for obtaining satisfactory fractal structure. The deposition is preferably within a range from 10 to 200 Å/s, more preferably from 30 to 150 Å/s, and most preferably from 50 to 100 Å/s.

The film forming temperature is so controlled as to gradually rise in the course of deposition of the transparent conductive layer, for obtaining satisfactory fractal structure. In the initial period of deposition, the temperature is preferably maintained within a range from the room temperature to 450° C., more preferably from 500 to 350° C., and most preferably 70° to 300° C. Various fractal structures can be obtained by varying the temperature rising pattern.

The pressure in the deposition chamber is variable depending on the species of gas and the dimension of the deposition apparatus, but generally preferred is the pressure from 1 to 100 mTorr. The pressure is a factor influencing the surface of the film deposition. A relatively high pressure allows for a complex fractal structure. Also various fractal structures can be obtained by increasing or decreasing the deposition pressure in the course of film formation.

The above-mentioned gases are introduced into the deposition chamber in predetermined amounts through mass flow controllers, and the introduced amounts are suitably determined according to the volume of the deposition chamber. The ratio of HF with respect to Ar is preferably within a range from 0.1 to 10%.

[Substrate]

The substrate 101 can be composed of a conductive material or of an electrically insulating material. It may also be composed of a semiconductor bulk crystal. It may also be composed of a translucent material such as glass or of an opaque material, but is preferably composed of a material with limited deformation or distortion, and with a desired mechanical strength.

Specific examples of the material constituting the substrate include a thin plate or a composite thereof of a metal such as Fe, Ni, Cr, Al, Mo, Au, Nb, Ta, V, Ti, Pt or Pb, or an alloy thereof such as brass or stainless steel; a film or a sheet of heat-resistant synthetic resin such as polyester, polyethylene, polycarbonate, cellulose acetate, polypropylene, polyvinyl chloride, polyvinylidene chloride, polystyrene, polyamide, polyimide or epoxy resin and a composite material thereof with glass fibers, carbon fibers, boron fibers or metal fibers; such thin metal plate or resin sheet surfacially provided with a layer of a different metal and/or an insulating film of $SiO_2$, $Si_3N_4$, $Al_2O_3$ or AlN formed for example by sputtering, evaporation or plating; glass; and ceramics.

The substrate, if composed of an electrically conductive material such as metal, may be utilized as the current-extracting electrode. If it composed of an electrically insulating material such as synthetic resin, it is desirable to form, on a surface to be subjected to the film deposition, the current-extracting electrode by forming a metal or an alloy such as Al, Ag, Pt, Au, Ni, Ti, Mo, W, Fe, V, Cr, Cu, stainless steel, brass, chromium dioxide, $SnO_2$, $In_2O_3$, ZnO or ITO and a transparent conductive oxide (TCO) by plating, evaporation or sputtering.

Naturally, even in case the substrate is composed of an electrically conductive material such as metal, a layer of a different metal or the like may be formed on the surface to be subjected to the film deposition, for example for the purpose of increasing the reflectivity of the surface of the substrate for the long-wavelength light or preventing the mutual diffusion of the constituting elements of the substrate and the deposited film.

In case of a photovoltaic element in which the substrate is relatively transparent and the light is introduced from the side of such substrate, the substrate is subjected to the formation of the transparent conductive layer such as of above-mentioned transparent conductive oxide or metal, and the formation of the semiconductor layer, and a rear reflective metal layer, serving also as the rear electrode, is deposited.

These materials, to be used as the substrate, are desirably shaped as a sheet or a web-shaped sheet which is formed as a roll wound around a cylindrical member. In case of forming the substrate by forming a thin film on a base material, such thin film may be formed for example by vacuum evaporation, sputtering, screen printing, dip coating or plasma CVD.

The surface smoothness Ra of the substrate is preferably 5.0 μm or less. The substrate surface may be suitably etched with an acidic solution such as of $HNO_3$, HF, HCl or $H_2SO_4$, to treat the surface irregularities. The substrate may be made as thin as desired so long as it is sufficient to serve as the substrate, if flexibility is required therefor. However, in consideration of the manufacture, handling and mechanical strength of the substrate, the thickness thereof is usually 10 μm or larger.

[Metal layer]

In case of a photovoltaic element in which the light is introduced into the semiconductor layer from the side opposite to the substrate, the metal layer 1022 is provided at the rear side of the semiconductor layer with respect to the light introducing direction, and serves as a light reflecting layer which reflects the light, that cannot be fully absorbed in the semiconductor layer, toward the semiconductor layer again and also as a rear electrode of the photovoltaic element. In such case, there is preferred a material of high reflectivity, among the aforementioned materials. Particularly preferred is gold, silver, copper, aluminum, magnesium or an alloy thereof. A metal of high reflectivity reflects the light, that cannot be fully absorbed in the semiconductor layer, toward the semiconductor layer again with the high reflectivity, thereby extending the optical path length therein, thus increasing the light absorption therein and increasing the short-circuiting current Jsc of the photovoltaic element.

In case the substrate is electrically conductive, the substrate itself may constitute the light reflecting layer. In such case, the transparent conductive layer 102 featuring the present invention is provided at the rear side of the semiconductor layer with respect to the light introducing direction, and serves as a light reflection increasing layer for increasing the reflection of the light reflecting layer and also as a layer for preventing mutual diffusion of the constituent elements and as a rear electrode of the photovoltaic element.

In such case, there is preferred a material with high transmittance and high electrical conductivity, among the aforementioned materials. Particularly preferred principal material is an oxide or a nitride of aluminum, zinc, tin, indium, titanium or tantalum, or a complex compound thereof.

The thickness of the metal layer is preferably at least equal to 100 Å and not exceeding 10 μm, because a smaller thickness reduces the conductivity while a larger thickness increases the light absorption. Particularly preferred is the thickness at least equal to 300 Å and not exceeding 5 μm.

Also the metal layer and the transparent conductive layer may be composed of three or more laminated films, for example in order to improve the reflectivity of the transparent conductive layer for the long-wavelength light on the substrate surface and to prevent the mutual diffusion of the constituent elements of the transparent conductive layer and the semiconductor layer.

In such case, the metal layer is preferably composed of a material of high reflectivity, among the aforementioned materials. Particularly preferred is gold, silver, copper, aluminum, magnesium or an alloy thereof. A metal of high reflectivity reflects the light, that cannot be fully absorbed in the semiconductor layer, toward the semiconductor layer again with the high reflectivity, thereby extending the optical path length therein, thus increasing the light absorption therein and increasing the short-circuiting current Jsc of the photovoltaic element.

[Semiconductor layer]

The semiconductor layer employed in the present invention can be composed of a group-IV element such as Si, C or Ge, a group-IV alloy such as SiGe, SiC or SiSn, a group II–VI compound such as CdS or CdTe, or a group I–III–VI2 compound such as $CuInSe_2$, $Cu(InGa)Se_2$ or $CuInS_2$.

Among the semiconductor materials mentioned above, particularly preferred for the photovoltaic element of the present invention is an amorphous, microcrystalline or polycrystalline group-IV or group-IV alloy semiconductor material, such as a-Si:H (hydrogenated amorphous silicon), a-Si:F, a-Si:H:F, a-SiGe:H, a-SiGe:F, a-SiGe:H:F, a-SiC:H, a-SiC:F or a-SiC:H:F.

The semiconductor layer may also be subjected to valence electron control and forbidden band width control. More specifically, a raw material compound containing an element serving as the valence electron controlling agent or the forbidden band controlling agent may be introduced into the film forming space at the formation of the semiconductor layer, either singly or as a mixture with the aforementioned deposition film forming gas or the aforementioned diluting gas. The semiconductor layer is doped in at least a part thereof in p-type and n-type by valence electron control, thereby forming at least a pin junction. A so-called stacked cell structure can be obtained by forming plural pin junctions in overlaid manner.

The semiconductor layer can be formed by various CVD methods such as microwave plasma CVD, RF plasma CVD, photo CVD, thermal CVD or MOCVD; various evaporation methods such as EB evaporation, MBE, ion plating or ion beam evaporation; sputtering, spray coating or printing. Industrially there is preferred the plasma CVD in which the raw material gas is decomposed by plasma and deposited on the substrate.

For the apparatus for reaction, there can be employed a batch-type apparatus or a continuous film forming apparatus according to the desired purpose.

In the following there will be given a more detailed explanation on the semiconductor layer employing the group-IV amorphous semiconductor material or the group-IV alloy amorphous semiconductor material, which is particularly suitable for the photovoltaic element of the present invention.

(1) i-type (intrinsic) semiconductor layer

The hydrogen atoms (H, D) or the halogen atoms (X) contained in the i-type layer serve to compensate the uncombined dangling bonds of the i-type layer, thereby increasing the product of mobility and life of the carries in the i-type layer. They also serve to compensate the interfacial energy levels at the p/i-interface and n/i-interface, thereby improving the photoelectromotive force, photocurrent and photoresponse of the photovoltaic element.

The optimum content of the hydrogen atoms (H, D) and/or the halogen atoms (X) contained in the i-type layer is within a range of 1 to 40 at. %. In particular, there is preferred a form of distribution in which the hydrogen atoms and/or the halogen atoms are distributed in a larger amount at the side of the p/i-interface or n/i-interface, and the content of the hydrogen atoms and/or the halogen atoms in the vicinity of such interface is preferably within a range of 1.1 to 2 times of the content in the bulk area. Furthermore, the content of the halogen atoms and/or the halogen atoms preferably shows a variation corresponding to the content of the silicon atoms.

Also in the photovoltaic element of stacked cell structure, there are desirably employed a material of a wider band gap in the i-type semiconductor layer of the pin junction closer to the light entrance side and a material of a narrower band gap in the i-type semiconductor layer of the pin Junction farther from the light entrance side.

The amorphous silicon and amorphous silicon-germanium are represented, according the element for compensating the dangling bonds, as a-Si:H, a-Si:F, a-Si:H:F, a-SiGe:H, a-SiGe:F, a-SiGe:H:F etc.

Besides, the i-type semiconductor layer suitable for the photovoltaic element of the present invention is preferably provided with a hydrogen atom content (CH) within a range of 1.0 to 25.0%; a photoconductivity ($\sigma$ P) of $1.0 \times 10^{-7}$ S/cm or higher under the irradiation with artificial solar light of AM 1.5 and 100 mW/cm$^2$; a dark conductivity ($\sigma$ d) of $1.0 \times 10^{-9}$ S/cm or lower; an arbac energy by the constant photocurrent method (CPM) of 55 meV or less; and a localized energy level density of $10^{17}$/cm$^3$ or less.

Furthermore, a slightly p-type or n-type layer can also be utilized as the i-type layer.

(2) p-type or n-type semiconductor layer

The amorphous material (represented as a-) and the microcrystalline material (represented as $\mu$ c-) constituting the p-type or n-type semiconductor layer can be, for example, a-Si:H, a-Si:HX, a-SiC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, a-SiOCN:HX, $\mu$ c-Si:H, $\mu$ c-Si:HX, $\mu$ c-SiC:H, $\mu$ c-SiC:HX, $\mu$ c-SiO:H, $\mu$ c-SiO:HX, $\mu$ c-SiN:H, $\mu$ c-SiN:HX, $\mu$ c-SiGeC:H, $\mu$ c-SiGeC:HX, $\mu$ c-SiON:H, $\mu$ c-SiON:HX, $\mu$ c-SiOCN:H, $\mu$ c-SiOCN:HX etc., containing a p-type valence electron controlling agent (for example atoms of group III of the periodic table such as B, Al, Ga, In or Tl) or an n-type valenceelectron controlling agent (for example atoms of group V of the periodic table such as P, As, Sb or Bi) at a high concentration.

The polycrystalline material (represented as poly-) can be, for example, poly-Si:H, poly-Si:HX, poly-SiC:H, poly-SiC:HX, poly-SiO:H, poly-SiO:HX, poly-SiN:H, poly-SiN:HX, poly-SiGeC:H, poly-SiGeC:HX, poly-SiON:H, poly-SiON:HX, poly-SiOCN:H, poly-SiOCN:HX, poly-Si, poly-SiC, poly-SiO, poly-SiN, etc., containing a p-type valence electron controlling agent (for example atoms of group III of the periodic table such as B, Al, Ga, In or Tl) or an n-type valence electron controlling agent (for example atoms of group V of the periodic table such as P, As, Sb or Bi) at a high concentration.

For the p-type or n-type layer at the light entrance side, particularly suitable is a crystalline semiconductor layer of low light absorption or an amorphous semiconductor layer of a wide band gap.

The optimum amount of addition of the atoms of group III of the periodic table to the p-type layer or of those of group V of the periodic table to the n-type layer is within a range of 0.1 to 50 at. %.

The hydrogen atoms (H, D) or the halogen atoms contained in the p- or n-type layer serve to compensate the uncombined dangling bonds in the p- or n-type layer, thereby improving the doping efficiency thereof. The optimum amount of addition of the hydrogen or halogen atoms is within a range of 0.1 to 40 at. %. In particular, when the p- or n-type layer is crystalline, the optimum amount of addition of the hydrogen or halogen atoms is within a range of 0.1 to 8 at. %.

In particular, there is preferred a form of distribution in which the hydrogen atoms and/or the halogen atoms are distributed in a larger amount at the side of the p/i-interface or n/i-interface, and the content of the hydrogen atoms and/or the halogen atoms in the vicinity of such interface is preferably within a range of 1.1 to 2 times of the content in the bulk area. Such increased content of the hydrogen atoms or the halogen atoms in the vicinity of the p/i-interface or n/i-interface allows for reduction of the defect levels and the mechanical strains in the vicinity of such interface, thereby increasing the photoelectromotive force and the photocurrent of the photovoltaic element of the present invention.

With respect the electrical characteristics, the p- and n-type layers of the photovoltaic element have an activation energy preferably not exceeding 0.2 eV, most preferably not exceeding 0.1 eV, and a specific resistivity preferably not exceeding 100 $\Omega$ cm, most preferably not exceeding 1 $\Omega$ cm. Also the thickness of the p- or n-type layer is preferably within a range of 1 to 50 nm, most preferably 3 to 10 nm.

Examples of the material employing the elements of groups II–VI, constituting the p- or n-type semiconductor layer, include CdS, CdTe, ZnO, and ZnSe, and those employing the elements of groups I–III–VI2 include CuInSe$_2$, Cu(InGa)Se$_2$, CuInS$_2$, CuIn(Se,S)$_2$ and CuInGaSeTe.

(3) Method of forming semiconductor layer

For forming the amorphous group-IV or group-IV alloy semiconductor layer suitable for use in the photovoltaic element of the present invention, there is preferably employed a plasma CVD method utilizing an AC current or a high frequency current such as RF plasma CVD or microwave plasma CVD.

In the plasma CVD, the gases such as the raw material gas and the diluting gas are introduced into a deposition chamber (vacuum chamber) that can be evacuated, and the internal pressure of the deposition chamber is maintained constant under the evacuation by a vacuum pump. For generating plasma, a microwave generated by a microwave source is guided by a wave guide and introduced into the deposition chamber through a window (composed of alumina ceramics etc.) thereof. Otherwise a high frequency electromagnetic wave is applied by an electrode. The raw material gas is decomposed by thus generated plasma, whereby a desired deposition film is formed on the substrate positioned in the deposition chamber.

In case of film deposition by microwave plasma CVD, the preferred conditions include a temperature of the substrate in the deposition chamber within a range of 100° to 450° C., an internal pressure within a range from 0.5 to 30 mTorr, a microwave power within a range from 0.01 to 1 W/cm$^3$, and a microwave frequency within a range from 0.1 to 10 GHz.

In case of film deposition by RF plasma CVD, the preferred conditions include a temperature of the substrate in the deposition chamber within a range of 100° to 350° C., an internal pressure within a range from 0.1 to 10 Torr, an RF power within a range from 0.001 to 5.0 W/cm$^3$, and a deposition rate within a range from 0.1 to 30 Å/sec.

In forming the amorphous group-IV or group-IV alloy semiconductor layer suitable for use in the photovoltaic element of the present invention, examples of the suitable raw material gas include silicon-containing gasifiable compounds, germanium-containing gasifiable compounds, carbon-containing gasifiable compounds, and mixtures thereof.

Specific examples of such silicon-containing gasifiable compounds include gaseous or easily gasifiable linear and cyclic silanes such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$ or $Si_2Cl_3F_3$.

Also specific examples of such germanium-containing gasifiable compounds include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$ or $Ge_2D_6$.

Also examples of the element for expanding the band gap of the i-type semiconductor layer, employed for forming the first p-type semiconductor layer of the photovoltaic element of the present invention, include carbon, oxygen and nitrogen.

Specific examples of the germanium-containing gasifiable compound include $CH_4$, $CD_4$, $C_nH_{2n+2}$ (n being an integer), $C_nH_{2n}$ (n being an integer), $C_2H_2$, $C_6H_6$, $CO_2$ and CO. Also examples of the nitrogen-containing gas include $N_2$, $NH_3$, $ND_3$, NO, $NO_2$ and $N_2O$. Also examples of the oxygen-containing gas include $O_2$, CO, $CO_2$, NO, $NO_2$, $N_2O$, $CH_3CH_2OH$ and $CH_3OH$.

Also examples of the substance to be introduced into the n-type or p-type layer for valence electron control include elements of group III of the periodic table.

Examples of the effective starting materials for introducing the group-III element include, for introducing boron atoms, boron hydrides such as $B_2H_6$, $B_4H_{10}$, $B_5H_9$, $B_5H_{11}$, $B_6H_{10}$, $B_6H_{12}$ or $B_6H_{14}$, and boron halides such as $BF_3$ or $BCl_3$. Other examples include $AlCl_3$, $GaCl_3$, $InCl_3$ and $TlCl_3$. Among these materials particularly preferred are $B_2H_6$ and $BF_3$.

Examples of the effective starting materials for introducing the group-V element include, for introducing phosphor atoms, phosphor hydrides such as $PH_3$ or $P_2H_4$, and phosphor halides such as $PH_4I$, $PF_3$, $PF_5$, $PCl_3$, $PCl_5$, $PBr_3$, $PBr_5$ or $PI_3$. Other examples include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$. Among these materials particularly preferred are $PH_3$ and $PF_3$.

The above-mentioned gasifiable compound may be introduced into the deposition chamber after suitable dilution with gas such as $H_2$, He, Ne, Ar, Xe or Kr. Particularly in case of depositing a layer with low light absorption or with a wide band gap composed of the microcrystalline or polycrystalline semiconductor or of a-SiC:H, it is preferred to dilute the raw material gas 2–100 times with hydrogen gas, and to introduce a relatively high microwave or RF power.

[Transparent electrode]

The transparent electrode 107 constitutes the electrode at the light entrance side and serves also as an antireflection film by the optimization of the film thickness. The transparent electrode 107 is required to have a high transmittance at the wavelength range which is absorbable by the semiconductor layer, and a low resistivity. The transmittance in the wavelength range longer than 550 nm is preferably 80% or higher, more preferably 85% or higher. Also the resistivity is preferably $5 \times 10^{-3}$ Ω cm or lower, more preferably $1 \times 10-3$ Ω cm or lower.

The preferred material therefor is a conductive oxide such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$ or $Na_xWO_3$, or a mixture thereof. Particularly preferred is a metal oxide selected from $SnO_2$, $In_2O_3$ and ITO, or a complex oxide thereof.

Such compound may further be added with an element (dopant) for varying the electric conductivity. For such dopant, there can advantageously be employed Al, In, B, Ga, Si, F, etc. in case the transparent electrode 107 is composed of ZnO; Sn, F, Te, Ti, Sb, Pb, etc. in case of $In_2O_3$; and F, Sb, P, As, In, Tl, Te, W, Cl, Br, I, etc. in case of $SnO_2$.

The transparent electrode 107 can be advantageously formed for example by various evaporation methods such as EB evaporation or sputtered evaporation, various CVD methods, spray coating, spin-on coating or dip coating.

[Current-collecting electrode]

The current-collecting electrode 108 is formed on a part of the transparent electrode 107 according to the necessity in case the resistivity thereof cannot be made sufficiently low and serves to reduce the resistivity of the electrode and to lower the serial resistance of the photovoltaic element.

Examples of the material constituting the current-collecting electrode include metals such as gold, silver, copper, aluminum, nickel, iron, chromium, molybdenum, tungsten, titanium, cobalt, tantalum, niobium and zirconium, alloys such as stainless steel, and conductive paste employing powdered metal.

It is so formed as to minimize the interception of the incident light into the semiconductor layer. Within the entire area of the photovoltaic element, the area of the current-collecting electrode is preferably 15% or less, more preferably 10% or less and most preferably 5% or less.

The current-collecting electrode can be formed, in case of using conductive paste, for example by evaporation, sputtering, plating or printing, and, in case of using a metal wire, by covering the outer periphery of the metal wire with thermoplastic conductive paste and adhering the wire under heat and pressure.

For obtaining a photovoltaic device (module or panel) of desired output voltage and output current, the photovoltaic elements of the present invention are connected in series and/or in parallel, then protective layers are formed on the top and rear sides, and electrodes for obtaining the output current are mounted. In these operations, the substrate bearing the photovoltaic element may be positioned on another substrate. Also in case of serially connecting the photovoltaic elements of the present invention, there may be incorporated diodes for preventing inverse current.

EXAMPLE 1

Figure 1B:
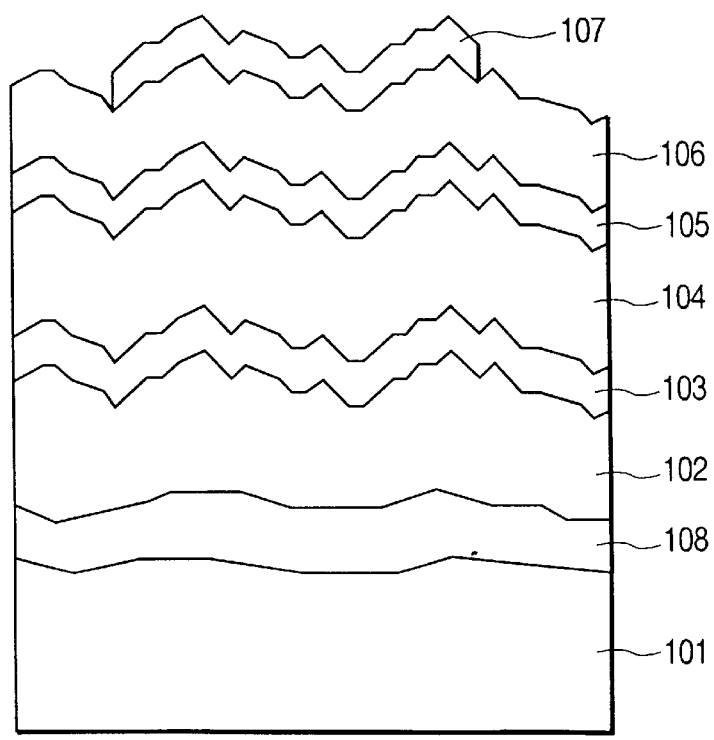
Figure 2A:
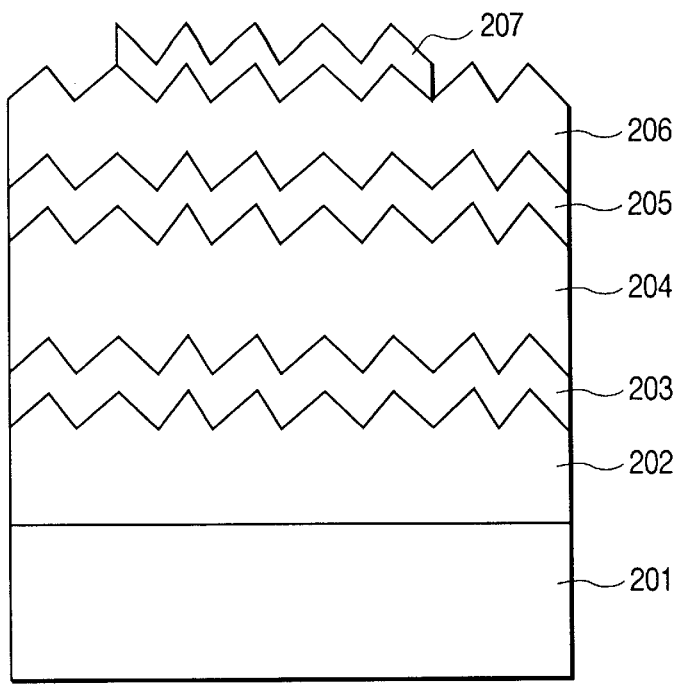
FIGS. 2A and 2B are cross-sectional views of conventional photovoltaic elements.
Figure 2B:
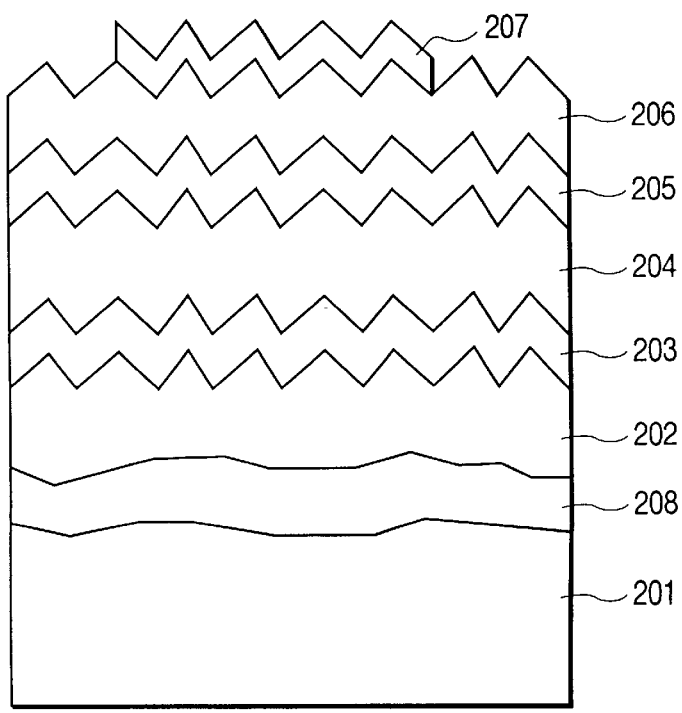
Figure 3:
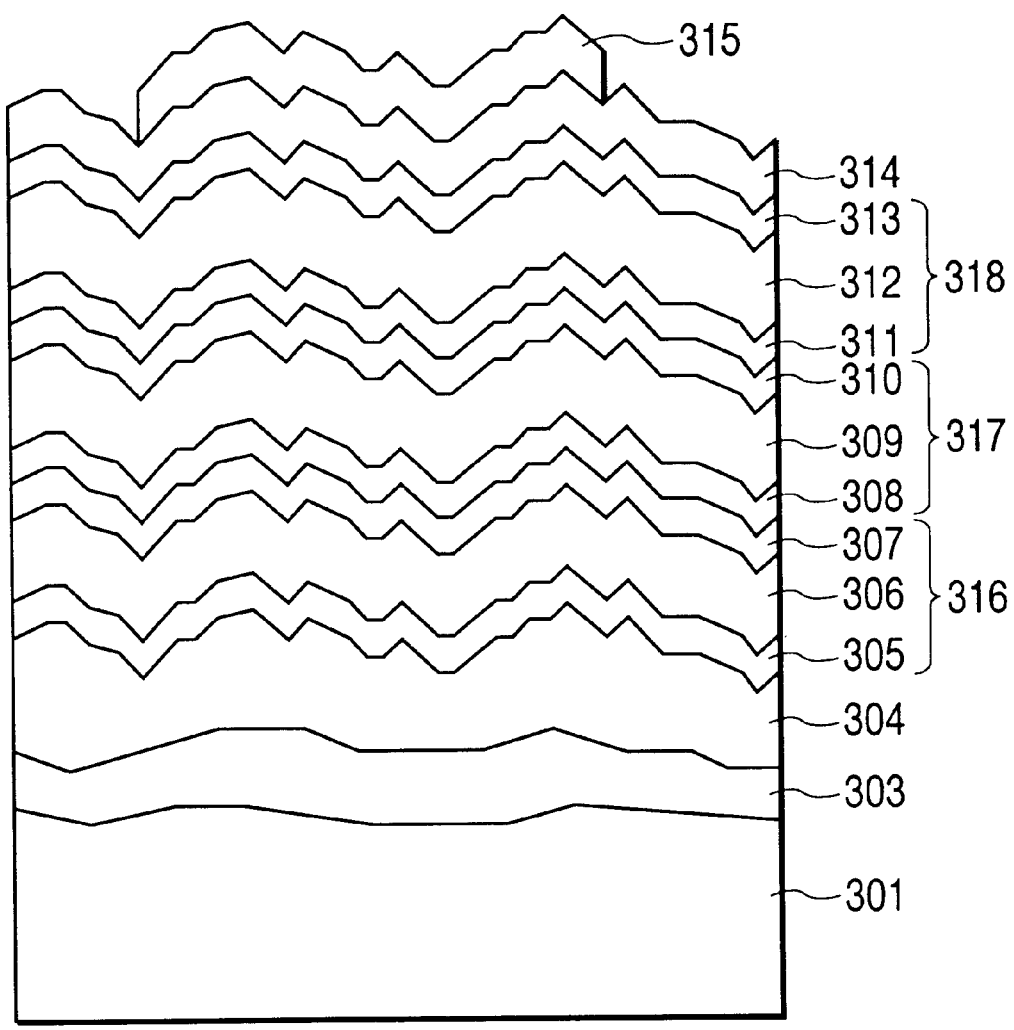
FIG. 3 is a cross-sectional view of photovoltaic elements of the present invention.

A solar cell of the configuration shown in FIG. 1A was prepared by depositing the transparent conductive layer with a deposition apparatus shown in FIG. 5 and depositing the photoelectric conversion layer with a deposition apparatus shown in FIG. 6.

FIG. 5 shows an example of the apparatus capable of executing RF magnetron sputtering and DC magnetron sputtering. In a deposition chamber 501, a substrate holder 502 supports a substrate 503, which can be maintained at a desired temperature by a heater 504. An RF power is supplied through a matching box 505, from an RF source 506 to the substrate holder. A metal target 507 for forming the metal layer, and first and second targets 508, 509 for forming the transparent conductive layer respectively receive power supply from a DC power source 510, an RF power source 511 and a DC power source 512. The targets are respectively provided with shutters 513, 514, 515. The raw material gas is introduced from a gas supply pipe 517, and the interior of the deposition chamber is maintained at a desired pressure by an exhaust pipe 516. A rotating shaft 518 serves to rotate the substrate holder 502. In addition there are provided a gas supply device connected to the gas supply pipe 517 and a vacuum pump connected to the exhaust pipe 516, though they are not illustrated. An arrow 521 indicates the direction of air evacuation.

Table 2 shows the conditions for forming ZnO as the transparent conductive layer 102.

TABLE 2

Substrate: glass; thickness 1.1 mm, size 50 × 50 mm
(#7059 supplied by Corning corp.);
ultrasonic washed with acetone and isopropanol and
dried with warm air
Sputtering gas: Ar 50 sccm, $H_2$ 5 sccm and HF 2 sccm
Pressure: 9 mTorr
Substrate temperature: 150° C.
RF power: 300 W
Deposition rate: 70 Å/s
Film forming temperature: temperature raised at a rate
of 2.0° C./s for initial 20 seconds, then at a rate of
0.7° C./s for succeeding 230 seconds, thereafter
constant.
Pressure: pressure increased at a rate of 0.03 mTorr/s
for initial 100 seconds, then at a rate of 0.05 mTorr/s
for succeeding 150 seconds, thereafter constant.
Layer thickness: 2.0 μm FIG. 6 shows an apparatus capable of executing the plasma CVD for forming the semiconductor layer, wherein shown are a reaction chamber 601, a substrate 602 bearing the conductive thin film thereon, a heater 603, a conductance valve 604, a microwave guide 605, a microwave inlet 606, a microwave introducing window 607 composed, for example, of alumina ceramics, an RF introducing window 608, an RF power source 609 with a matching circuit therein, plasma 610, a shutter 611, an exhaust pipe 614, and a gas supply pipe 615. An arrow 612 indicating the proceeding direction of the microwave, an arrow 613 indicates the direction of air evacuation, and an arrow 616 indicates the direction of gas supply. A microwave source is connected to the microwave guide, while a vacuum pump is connected to the illustrated exhaust pipe, and a gas supply device is connected to the gas supply pipe, though they are not illustrated. The plasma CVD apparatus is composed of the members mentioned above. Table 3 shows the conditions of formation of the semiconductor layer, the transparent electrode and the current-collecting electrode.

TABLE 3

[n-type a-Si layer]

$H_2$ gas: 300 sccm
Pressure: 1.0 Torr
Substrate temperature: 250° C.
Raw material gas: $SiH_4$ 2 sccm; $PH_3/H_2$ 2 sccm; $H_2$ 100 sccm
RF power: 5W, applied to the bias electrode
Layer thickness: 20 nm
[i-type a-Si layer]

$H_2$ gas: 500 sccm
Pressure: 0.01 Torr
Substrate temperature: 350° C.
Raw material gas: $SiH_4$ 50 sccm; $H_2$ 500 sccm
Deposition pressure: 0.02 Torr
MW power: 500 W
Layer thickness: 200 nm
[p-type μ c-Si layer]

$H_2$ gas: 500 sccm
Pressure: 1 Torr
Substrate temperature: 200° C.
Raw material gas: $SiH_4$ 2 sccm; $H_2$ 100 sccm; $BF_3/H_2$ 500 sccm
Deposition pressure: 1 Torr
RF power: 50 W
Layer thickness: 10 nm Then an ITO film as the transparent electrode was formed thereon with a thickness of 70 nm by resistance-heated vacuum evaporation, and Cr (40 nm)/Ag (1000 nm)/Cr (40 nm) films were formed in succession, as the current-collecting electrode, by electron beam vacuum evaporation utilizing a comb-shaped mask.

Five photovoltaic cells were formed by varying, at the formation of the transparent conductive layer, the flow rate of HF as 1, 5, 10, 25 and 50% with respect to that Ar. The solar cells thus prepared are called (SC Example 1—1).

COMPARATIVE EXAMPLE 1—1

Solar cells (SC Comparative Example 1—1) were prepared under the same conditions as in the example 1, except that the thin ZnO layer was formed without the introduction of HF, with a constant forming temperature of 300° C. and with a constant pressure of 9 mTorr.

COMPARATIVE EXAMPLE 1-2

Solar cells (SC Comparative Example 1-2) were prepared under the same conditions as in the example 1, except that the thin ZnO layer was formed with the introduction of HF by an amount of 50% with respect to Ar, that the temperature was raised at a rate of 1.0° C./s for the initial 20 seconds of the film formation, then raised at a rate of 1.1° C./s for the succeeding 230 seconds and was thereafter maintained constant, and that the pressure was increased at a rate of 0.05 mTorr/s for the initial 100 seconds of the film formation, then increased at a rate of 0.1 mTorr/s for the succeeding 150 seconds and was thereafter maintained constant.

COMPARATIVE EXAMPLE 1-3

Solar cells (SC Comparative Example 1-3) were prepared under the same conditions as in the example 1, except that the thin ZnO layer was formed with the introduction of HF by an amount of 1% with respect to Ar, with a constant substrate temperature of 50° C. and with a constant pressure of 9 mTorr.

Each of the solar cells (SC Example 1—1), (SC Comparative Example 1—1), (SC Comparative Example 1-2) and (SC Comparative Example 1-3) was prepared in six units, which were subjected to the measurement of the initial photoelectric conversion efficiency (photoelectric motive force/incident light power), the vibrational deterioration and the photodeterioration.

The initial photoelectric conversion efficiency was obtained by subjecting the prepared solar cell to the irradiation with the light of AM-1.5 (100 mW/cm$^2$) and measuring the V-I characteristics.

The vibrational deterioration was determined by placing the solar cell, already subjected to the measurement of the initial photoelectric conversion efficiency, in a dark place with a temperature of 25° C. and a humidity of 50%, and, after application of vibration with a frequency of 60 Hz and an amplitude of 0.1 mm for 500 hours, measuring the decrease rate of the photoelectric conversion efficiency (photoelectric conversion efficiency after vibrational deterioration/initial photoelectric conversion efficiency).

The photodeterioration was determined by placing the solar cell, already subjected to the measurement of the initial photoelectric conversion efficiency, in an atmosphere of a temperature of 25° C. and a humidity of 50%, and, after irradiation with light of AM-1.5 for 500 hours, measuring the decrease rate of the photoelectric conversion efficiency (photoelectric conversion efficiency after photodeterioration/initial photoelectric conversion efficiency).

Table 4 summarizes the initial photoelectric conversion efficiency, the decrease rate of the photoelectric conversion efficiency after photodeterioration and that after vibrational deterioration obtained in these measurements in the cells (SC Comparative Example 1—1), (SC Comparative Example 1-2) and (SC Comparative Example 1-3) in comparison with those of (SC Example 1—1). The observed differences are principally ascribed to the difference in the fill factor and in the short-circuiting photocurrent.

TABLE 4

|  | Initial photoelectric conversion efficiency | Vibrational deterioration | Photodeterioration |
| --- | --- | --- | --- |
| SC Example 1-1 | 1.00 multiplied | 1.00 multiplied | 1.00 multiplied |
| SC Comparative Example 1-1 | 0.93 multiplied | 0.91 multiplied | 0.90 multiplied |

TABLE 4-continued

|  | Initial photoelectric conversion efficiency | Vibrational deterioration | Photodeterioration |
| --- | --- | --- | --- |
| SC Comparative Example 1-2 | 0.87 multiplied | 0.99 multiplied | 0.92 multiplied |
| SC Comparative Example 1-3 | 0.86 multiplied | 0.88 multiplied | 0.93 multiplied |

Also the surface shape of the solar cell, observed under an SEM and the fractal property were evaluated. The approximate shapes are shown in FIG. 10. The cells (SC Example 1-1) had a fractal dimension of 1.07 within a range of 40 to 400 nm. The cells (SC Comparative Example 1-1) showed periodical irregularities and had a fractal dimension 1.00 in the same range.

The cells (SC Comparative Example 1-2) showed complex shapes and had a fractal dimension of 1.29 in a range of 40 to 400 nm. The cells (SC Comparative Example 1-3) were flat and had a fractal dimension of 1.00 in the same range.

As will be apparent from the foregoing, the solar cells (SC Example 1—1) of the present invention are superior in characteristics to the conventional solar cells (SC Comparative Example 1—1) and (SC Comparative Example 1-3).

EXAMPLE 2

Solar cells of the configuration shown in FIG. 1B were prepared with apparatus similar to those employed in the example 1.

An Al metal layer 108 and a ZnO transparent conductive layer 109 were prepared under the conditions shown in Table 5.

TABLE 5

[Al layer] DC magnetron sputtering
Substrate: stainless steel plate; thickness 0.7 mm,
size 50 × 50 mm; ultrasonic washed with acetone and
isopropanol, and dried with warm air
Ar: 50 sccm
Pressure: 7 mTorr
Substrate temperature: 30° C.
DC power: 400 V
Layer thickness: 0.3 μm
[ZnO layer] RF magnetron sputtering
Sputtering gas: Ar 50 sccm
H$_2$ gas: 5 sccm
HF gas: 1 sccm
Pressure: 11 mTorr
Substrate temperature: 170° C.
RF power: 300 W
Deposition rate: 82 Å/s
Deposition temperature: raised at a rate of 1.8° C./s
for the initial 20 seconds, then raised at a rate of
0.6° C./s for the succeeding 210 seconds, and maintained
thereafter constant.
Deposition pressure: increased at a rate of 0.02
mTorr/s for the initial 80 seconds, then increased at a
rate of 0.05 mTorr/s for the succeeding 130 seconds and
maintained thereafter constant.
Layer thickness: 2.0 μm The semiconductor layer, the transparent electrode and the current-collecting electrode were prepared in a similar manner as in the example 1.

COMPARATIVE EXAMPLE 2-1

Solar cells (SC Comparative Example 2-1) were prepared under the same conditions as in the example 1, except that the ZnO layer was prepared without the introduction of HF, with a constant forming temperature of 320° C. and a constant pressure of 11 mTorr.

COMPARATIVE EXAMPLE 2—2

Solar cells (SC Comparative Example 2—2) were prepared under the same conditions as in the example 1, except that the thin ZnO layer was formed with the introduction of HF by an amount of 40% with respect to Ar, that the temperature was raised at a rate of 0.9° C./s for the initial 20 seconds of the film formation, then raised at a rate of 1.0° C./s for the succeeding 190 seconds and was thereafter maintained constant, and that the pressure was increased at a rate of 0.04 mTorr/s for the initial 90 seconds of the film formation, then increased at a rate of 0.09 mTorr/s for the succeeding 130 seconds and was thereafter maintained constant.

COMPARATIVE EXAMPLE 2-3

Solar cells (SC Comparative Example 2-3) were prepared under the same conditions as in the example 1, except that the thin ZnO layer was formed with the introduction of HF by an amount of 0.5% with respect to Ar, with a constant substrate temperature of 40° C. and with a constant pressure of 11 mTorr.

Each of the solar cells (SC Example 2), (SC Comparative Example 2-1), (SC Comparative Example 2-2) and (SC Comparative Example 2-3) was prepared in six units, which were subjected to the measurement of the initial photoelectric conversion efficiency (photoelectric motive force/incident light power), the vibrational deterioration and the photodeterioration as in the example 1 and also to the high-temperature high-humidity reverse bias test.

The high-temperature high-humidity reverse bias (HHRB) test (temperature 85° C., humidity 85%, applied bias −0.85 V) was conducted by placing the specimen in an environment chamber, connecting the specimen with the exterior for bias application, maintaining the chamber at a temperature of 85° C. and a humidity of 85%, and applying a bias of −0.85 V to the specimen for 500 hours. The result was evaluated by the rate of decrease of the shunt resistance Rsh.

Table 6 summarizes the initial photoelectric conversion efficiency, the decrease rate of the photoelectric conversion efficiency after photodeterioration and that after vibrational deterioration, and the decrease rate of the shunt resistance after the high-temperature high-humidity reverse bias test, obtained in these measurements in the cells (SC Comparative Example 2-1), (SC Comparative Example 2-2) and (SC Comparative Example 2-3) in comparison with those of (SC Example 2-1). The observed differences are principally ascribed to the difference in the fill factor and in the short-circuiting photocurrent.

TABLE 6

| | Initial photoelectric conversion efficiency | Vibrational deterioration | Photo-deterioration | HHRB test |
| --- | --- | --- | --- | --- |
| SC Example 2 | 1.00 multiplied | 1.00 multiplied | 1.00 multiplied | 1.00 multiplied |
| SC Comparative Example 2-1 | 0.94 multiplied | 0.90 multiplied | 0.89 multiplied | 0.01 multiplied |
| SC Comparative Example 2-2 | 0.85 multiplied | 0.98 multiplied | 0.93 multiplied | 0.10 multiplied |
| SC Comparative Example 2-3 | 0.87 multiplied | 0.89 multiplied | 0.92 multiplied | 0.90 multiplied |

TABLE 6-continued

Also the surface shape of the solar cell, observed under an SEM and the fractal property were evaluated. The cells (SC Example 2) had a fractal dimension of 1.09 within a range of irregularities from 40 to 400 nm. The cells (SC Comparative Example 2-1) showed periodical irregularities and had a fractal dimension 1.00 in the same range. The cells (SC Comparative Example 2—2) showed complex shapes and had a fractal dimension of 1.29 in a range of 40 to 400 nm. The cells (SC Comparative Example 2-3) were flat and had a fractal dimension of 1.00 in the same range.

As will be apparent from the foregoing, the solar cells (SC Example 2) of the present invention are superior in characteristics to the conventional solar cells (SC Comparative Example 2-1), (SC Comparative Example 2—2) and (SC Comparative Example 2-3).

EXAMPLE 3

A photodiode (PD Example 2) was prepared in the following manner. At first a substrate was prepared by ultrasonically washing a glass substrate of a thickness of 0.7 mm and a size of 20×20 mm with acetone and isopropanol, then drying the substrate with warm air, and forming thereon an Ag reflective layer of a thickness of 0.1 $\mu$m by vacuum evaporation at room temperature.

Then, with a method similar to that in the example 1 and with a 1:1 mixture of ZnO and $SnO_2$ as the target, a ZnSnO thin layer, an n-layer (a-Si, RFPCVD), an i-layer (a-Si, MWPCVD) and a p-layer ($\mu$c-Si, RFPCVD) were formed in succession on the substrate. Then, on the p-layer, a transparent electrode consisting of In-Zn complex oxide was formed with a thickness of 50 nm by electron beam-heated vacuum evaporation in the oxygen atmosphere. Then a mask with a comb-shaped aperture was placed on the transparent electrode, and a comb-shaped current-collecting electrode, consisting of Au of a thickness of 800 nm, was formed by electron beam vacuum evaporation. The preparation of the photodiode was completed in this manner.

COMPARATIVE EXAMPLE 3-1

Photodiodes (PD Comparative Example 3-1) were prepared under the same conditions as in the example 1, except that the ZnSnO layer was prepared without the introduction of HF, with a constant forming temperature of 300° C. and a constant pressure of 9 mTorr.

COMPARATIVE EXAMPLE 3-2

Photodiodes (PD Comparative Example 3-2) were prepared under the same conditions as in the example 1, except that the thin ZnSnO layer was formed with the introduction of HF by an amount of 50% with respect to Ar, that the temperature was raised at a rate of 1.0° C./s for the initial 20 seconds of the film formation, then raised at a rate of 1.1° C./s for the succeeding 210 seconds and was thereafter maintained constant, and that the pressure was increased at a rate of 0.05 mTorr/s for the initial 100 seconds of the film formation, then increased at a rate of 0.1 mTorr/s for the succeeding 150 seconds and was thereafter maintained constant.

COMPARATIVE EXAMPLE 3—3

Photodiodes (PD Comparative Example 3-3) were prepared under the same conditions as in the example 1, except that the thin ZnSnO layer was formed with the introduction of HF by an amount of 0.5% with respect to Ar, with a constant substrate temperature of 40° C. and with a constant pressure of 9 mTorr.

The photodiodes thus prepared were subjected to the measurement of on-off ratio ((photocurrent under the irradiation with light of AM1.5)/(dark current) ratio, measured with a measuring frequency of 20 kHz), and the on-off ratio thus measured is called the initial on-off ratio. Then the on-off ratio was measured after the photodeterioration and the vibrational deterioration as in the example 1. Table 7 summarizes the obtained results. It will be understood that the photodiodes (PD Example 3) of the present invention are superior in the characteristics to the conventional photodiodes (PD Comparative Example 3-1), (PD Comparative Example 3-2) and (PD Comparative Example 3—3).

TABLE 7

|  | Vibrational deterioration | Photodeterioration |
| --- | --- | --- |
| PD Example 3 | 1.00 multiplied | 1.00 multiplied |
| PD Comparative Example 3-1 | 0.89 multiplied | 0.87 multiplied |
| PD Comparative Example 3-2 | 0.98 multiplied | 0.94 multiplied |
| PD Comparative Example 3-3 | 0.85 multiplied | 0.91 multiplied |

EXAMPLE 4

A solar cell of laminated structure, involving a photoelectric conversion layer consisting of an N-type semiconductor layer, an I-type semiconductor layer and a P-type semiconductor layer, was prepared with the roll-to-roll deposition apparatus shown in FIGS. 7A, 7B, 8A, 8B and 8C.

The substrate was composed of a web-shaped stainless steel sheet of a length of 300 m, a width of 30 cm and a thickness of 0.1 mm.

An Al film and a ZnO film were deposited on the substrate by an apparatus shown in FIGS. 7A and 7B. The apparatus is provided, in succession, with a substrate feeding chamber 702, plural deposition chambers 703–706 and a substrate take-up chamber 707, which are mutually connected with separation paths 721. Each deposition chamber is connected through an exhaust pipe 719 to a diffusion pump 717 whereby the interior of the chamber can be evacuated. The web-shaped substrate 701 is supplied from the substrate feeding chamber to the substrate take-up chamber, through these deposition chambers and the separation paths. At the same time gases are introduced from the gas inlets of the deposition chambers and the separation paths and are discharged from the respective exhaust apertures, whereby the respective layers can be formed.

The deposition chamber 703 serves to form the Al film, while the deposition chambers 704–706 serve to form the ZnO film. The web-shaped stainless steel sheet is heated to a predetermined temperature in each deposition chamber by a heater 714.

The deposition chamber 703 executes DC magnetron sputtering, utilizing Ar gas introduced from a gas inlet 722 and an Al target, thereby generating plasma 715 and depositing the Al film.

The deposition chambers 704–706 execute RF magnetron sputtering, introducing Ar, $O_2$ and HF gasses and utilizing a ZnO target, thereby generating plasma 715 and depositing the ZnO film.

The deposition chambers are provided with gas introducing pipes 720, electrodes 713, a DC power source 712, RF power sources 725 and targets 723, and raw material gas supply devices (not shown) are connected to the gas introducing pipes 720. The exhaust aperture of each deposition chamber is connected to an oil diffusion pump 717 and another vacuum pump such as a mechanical booster pump (not shown). The separating path 721 connected to the deposition chambers is provided with a gas introducing pipe 710 for introducing sweeping gas 711. The substrate feeding chamber is provided with a feeding roll 708 and a guide roller 726 for constantly maintaining the substrate in horizontal position and giving a suitable tension thereto, while the substrate take-up chamber is provided with a take-up roll 709 and a guide roller 727. The substrate feeding chamber and the substrate take-up chamber are evacuated by vacuum pumps 716 such as mechanical booster pumps, through exhaust pipes 718.

Each deposition chamber is subjected to independent temperature control. Also in each deposition chamber, the temperature is so controlled as to have a temperature slope in the transporting direction of the substrate. Also the pressure in each deposition chamber is independently controlled by an unrepresented conductance valve.

An Al thin film (substrate temperature 30° C., layer thickness 300 nm) was formed on the substrate in the deposition chamber 703, and a ZnO film (layer thickness 2500 nm) was formed in the deposition chambers 704–706. The pressure and the Ar flow rate in the deposition chamber 703 were respectively 7 mTorr and 200 sccm, and the flow rates of Ar, $O_2$ and HF in the deposition chambers 704–706 were respectively 210, 100 and 5 sccm.

The forming temperature, the pressure and the deposition rate in the deposition chambers 704–706 were selected in the following manner. The forming temperature was so controlled, in the deposition chamber 704, as to slope from 150° C. at the entrance to 200° C. at the exit thereof, then in the deposition chamber 705, as to slope from 200° C. to 250° C., and as to be constant at 300° C. in the deposition chamber 706.

The pressure was controlled at 9 mTorr in the deposition chamber 704, 15 mTorr in the deposition chamber 705 and 25 mTorr in the deposition chamber 706. The deposition rate was controlled at 60 Å/s in the deposition chamber 704, 90 Å/s in the deposition chamber 705 and 70 Å/s in the deposition chamber 706.

Figure 8A:
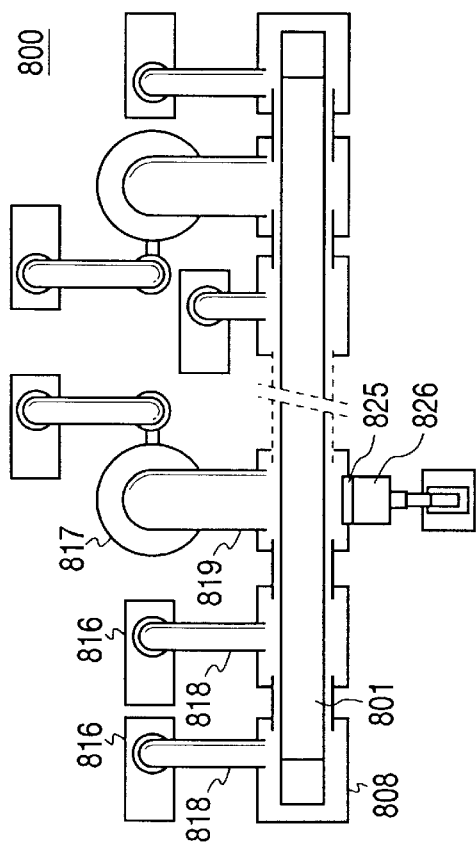
FIGS. 8A, 8B and 8C are respectively a plan view, an elevation view and a view showing the arrangement of deposition chambers, showing an apparatus for forming the semiconductor layer of the photovoltaic element of the present invention.
Figure 8B:
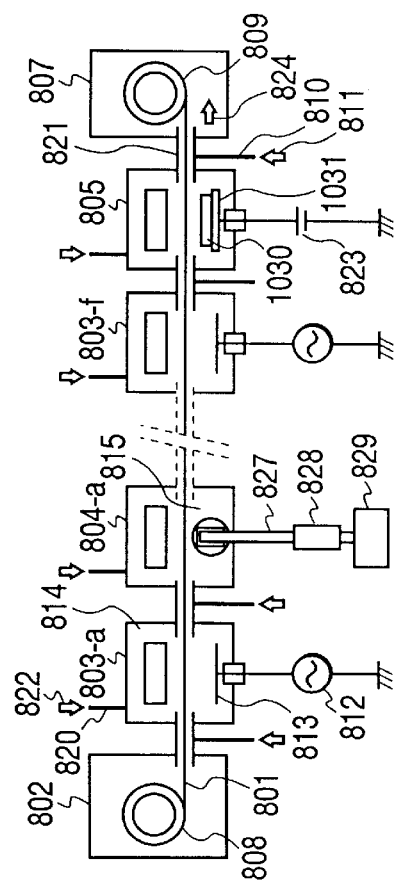
Figure 8C:
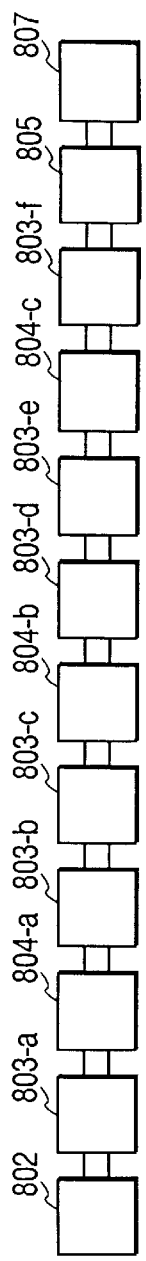

FIGS. 8A to 8C illustrate a deposition apparatus for the photoelectric conversion layer and the transparent electrode. The apparatus is provided, in succession, with a substrate feeding chamber 902, plural deposition chambers 803–805 and a substrate take-up chamber 807, which are mutually connected with separation paths 821. Each deposition chamber is provided with an exhaust aperture, whereby the interior of the chamber can be evacuated. The web-shaped substrate 901 is supplied from the substrate feeding chamber 802 to the substrate take-up chamber 807, through these deposition chambers and the separation paths. At the same time gases are introduced from the gas inlets of the deposition chambers and the separation paths and are discharged from the respective exhaust apertures, whereby the respective layers can be formed. The deposition chambers 803–804 serve to form the N-type, I-type and P-type semiconductor layers, while the deposition chamber 805 serves to form the transparent electrode consisting of ITO. The web-shaped stainless steel sheet is heated to a predetermined temperature in each deposition chamber by a halogen lamp heater 814, which heats the substrate from the rear side. The deposition chambers 803-b–804-c are not illustrated in FIGS. 8A and 8B.

The deposition chamber 805 executes RF magnetron sputtering, introducing $O_2$ and Ar and utilizing an ITO ($In_2O_3$—$SnO_2$(5 wt. %)) target. Each deposition chamber is provided with a raw material gas inlet 820, an exhaust pipe 818 and an RF electrode 813 or a microwave applicator 826, and a raw material gas supply device (not shown) is connected to the gas introducing pipe 820. The exhaust aperture of each deposition chamber is connected to an oil diffusion pump 817 and a vacuum pump 816 such as a mechanical booster pump. The separating path 821 connected to the deposition chambers is provided with a gas introducing pipe 810 for introducing sweeping gas 811.

The deposition chamber 804 can execute ordinary MWPCVD, while the deposition chamber 803 can execute ordinary RFPCVD. The substrate feeding chamber is provided with a feeding roll 808 and a guide roller 826 for constantly maintaining the substrate in horizontal position and giving a suitable tension thereto, while the substrate take-up chamber is provided with a take-up roll 809 and a guide roller 828.

At first the stainless steel sheet, bearing thereon the deposited transparent conductive layer, is wound on the feeding roll, then set in the substrate feeding chamber, made to pass through the deposition chambers and wound, at the leading end, onto the take-up roll. Then the entire apparatus is evacuated with the vacuum pumps, and the lamp heaters in the deposition chambers are turned on and so adjusted that the substrate assumes the predetermined temperatures in the deposition chambers. When the pressure of the entire apparatus becomes 1 mTorr or less, the sweeping gas 811 is introduced from the sweeping gas introducing pipes 811 and the substrate is moved in a direction 824 and is taken up on the take-up roll. Then the raw material gases are introduced into the deposition chambers. The gas flow rate in each separation path and the pressure in each deposition chamber are so controlled that the raw material gases introduced into each deposition chamber do not diffuse to other deposition chambers.

Then the RF or MW powers are introduced to generate plasma, thereby forming respective layers. There is executed formation of a first n-layer (a-Si, thickness 30 nm) in the deposition chamber 803-a; a first i-layer (a-SiGe, thickness 150 nm) in the deposition chamber 804-a; a first p-layer ($\mu$ c-Si, thickness 10 nm) in the deposition chamber 803-b; a second n-layer (a-SiGe, thickness 20 nm) in the deposition chamber 803-c; a second i-layer (a-Si, thickness 20 nm) in the deposition chamber 804-b; a second p-layer ($\mu$ c-Si, thickness 10 nm) in the deposition chamber 803-d; a third n-layer (a-Si, thickness 20 nm) in the deposition chamber 803-e; a third i-layer (a-Si, thickness 120 nm) in the deposition chamber 804-b; a third p-layer ($\mu$ c-Si, thickness 10 nm) in the deposition chamber 803-d; and a transparent electrode (ITO, thickness 75 nm) in the deposition chamber 805.

When the substrate was all taken up, all the MW, RF and sputtering power sources were cut off to extinguish the plasma, and the introduction of the raw material gases and the sweeping gas was terminated. Then the entire apparatus was returned to the ordinary pressure and the take-up roll was taken out.

Then carbon paste was printed with a thickness of 5 $\mu$m and a width of 0.5 mm by screen printing, and silver paste was printed thereon with a thickness of 10 $\mu$m and a width of 0.5 mm to form the current-collecting electrode, and thus prepared solar cell in roll form was cut into a size of 250×100 mm. The solar cell of laminate structure (SC Example 4) by the roll-to-roll method was prepared in this manner.

COMPARATIVE EXAMPLE 4

A solar cell (SC Comparative Example 4) was prepared under the same conditions as in the example 1, except that the ZnO film was deposited by introducing Ar gas into the deposition chambers 704–706 with a constant deposition temperature of 150° C., a constant pressure of 9 mTorr and a deposition rate of 60 Å/s.

Measurements similar to those in the example 2 revealed that the solar cell (SC Example 4) of the present invention was superior in characteristics to the conventional solar cell (SC Comparative Example 4). The obtained results are summarized in Table 8.

TABLE 8

|  | Initial photoelectric conversion efficiency | Vibrational deterioration | Photo-deterioration | HHRB test |
| --- | --- | --- | --- | --- |
| SC Example 4 | 1.00 multiplied | 1.00 multiplied | 1.00 multiplied | 1.00 multiplied |
| SC Comparative Example 4 | 0.93 multiplied | 0.91 multiplied | 0.88 multiplied | 0.05 multiplied |

Also the evaluation of the fractal property as in the example 2 indicated that the solar cell (SC Example 4) had a fractal dimension of 1.11 within a range from 40 to 400 nm, while the solar cell (SC Comparative Example 4) had a fractal dimension of 1.00 in the same range.

When the solar cells (SC Example 4) and (SC Comparative Example 4) were stored in rolled state for 3 months in a dark place, the peeling of the layers was not observed in the solar cell (SC Example 4) but slightly observed in the solar cell (SC Comparative Example 4).

Also a twisting test was conducted on the solar cell according to the method defined in JIS8917. A twisting action, displacing a corner of the solar cell by 4 cm while fixing the remaining three corners thereof, was repeated 100 times, and similar twisting actions were conducted on all the corners. The photoconductivity, the leak current and the open-circuit voltage under low illumination intensity were measured before and after the twisting operations, and the obtained values were respectively 0.99, 1.1 and 0.97 in comparison with those prior to the twisting operations. These results indicate that the photovoltaic module of the present invention has excellent characteristics.

What is claimed is:

1. A photovoltaic element comprising a transparent conductive layer between a substrate and a semiconductor layer;
   wherein a cross-section of said transparent conductive layer in contact with said semiconductor layer has a fractal configuration having a fractal dimension D within a range $1.01 \leq D \leq 1.20$, wherein a length of the fractal property r is within the range from 40 to 400 nm.

2. A photovoltaic element according to claim 1, wherein said transparent conductive layer is composed of plural layers.

3. A photovoltaic element according to claim 1, wherein the principal material constituting said transparent conductive layer is aluminum, zinc, tin, indium, titanium, or an oxide, a nitride or a sulfide of tantalum, or a complex compound thereof.

4. A photovoltaic element according to claim 1, wherein said transparent conductive layer has a thickness within a range from 100 Å to 10 μm.

5. A photovoltaic element according to claim 1, wherein said transparent conductive layer has an electrical conductivity within a range from 10E–8 (1/Ω cm) to 10E–2 (1/Ω cm).

6. A photovoltaic element according to claim 1, further comprising a metal layer between said transparent conductive layer and said substrate.

7. A photovoltaic element according to claim 6, wherein the principal material constituting said metal is gold, silver, copper, aluminum, magnesium or an alloy thereof.

8. A photovoltaic element according to claim 6, wherein said metal layer has a thickness within a range from 100 Å to 3 μm.

9. A pholtovoltaic element according to claim 1, wherein said semiconductor layer is composed of non-monocrystalline silicon semiconductor.

10. A photovoltaic element according to claim 1, wherein said semiconductor layer includes a layer containing at least an element selected from germanium, oxygen, nitrogen and carbon.

11. A photovoltaic element according to claim 1, wherein said substrate is composed of a material selected from metal, resin, a composite of resin and glass fibers, carbon fibers, boron fibers or metal fibers, a metal or a resin provided on the surface thereof with a different metal layer and/or an insulating film, glass and ceramics.

12. A photovoltaic element according to claim 11, further comprising a transparent electrode composed of an oxide of tin, indium or zinc or a complex oxide thereof, at the light entrance side of said semiconductor layer.

* * * * *

UNITED STATES PATENT AND TRADEMARK OFFICE
CERTIFICATE OF CORRECTION

PATENT NO. : 5,981,934
DATED : November 9, 1999
INVENTOR(S) : MAKOTO HIGASHIKAWA It is certified that error appears in the above-identified patent and that said Letters Patent is hereby corrected as shown below:

COLUMN 2:

Line 7, "p. 423)," should read --p. 1423),--.

COLUMN 4:

Line 22, "$1 \leq D \leq 2$" should read --$1 \leq D < 2$--;
    Line 46, "1/10 times 1/100 times etc." should read --1/10 times, 1/100 times, etc.--; and
    Line 49, "$N(r)r^{-D}$" should read --$N(r) \propto r^{-D}$--.

COLUMN 5:

Table 1, "1.25   +" should read --1.25   - --; and
    Line 44, "filmlaminated" should read --film laminated--.

COLUMN 10:

Line 12, "direction," should read --direction--.

COLUMN 11:

Line 47, "Junction" should read --junction--.

COLUMN 12:

Line 11, "valenceelectron" should read --valence electron--.

COLUMN 13:

Line 61, "$N_2O$. Also" should read --$N_2O$.¶Also--.

UNITED STATES PATENT AND TRADEMARK OFFICE
CERTIFICATE OF CORRECTION

PATENT NO.   :   5,981,934
DATED        :   November 9, 1999
INVENTOR(S)  :   MAKOTO HIGASHIKAWA It is certified that error appears in the above-identified patent and that said Letters Patent is hereby corrected as shown below:

COLUMN 14:

Line 24, "power. [Transparent" should read --power.¶ [Transparent--;
Line 34, "1x10-3" should read --$1 \times 10^{-3}$--;
Line 35, "therefor" should read --therefore--; and
Line 57, "gold,silver" should read --gold, silver--.

COLUMN 22:

Line 7,  "O2" should read --$O_2$--; and
         "gasses" should read --gases--;
Line 48, close up right margin; and
Line 49, close up left margin.

Signed and Sealed this

Twenty-eighth Day of November, 2000

Attest:

Q. TODD DICKINSON

*Attesting Officer*    *Director of Patents and Trademarks*